United States Patent
Nisitani et al.

(10) Patent No.: US 6,229,834 B1
(45) Date of Patent: *May 8, 2001

(54) LED DISPLAY DEVICE

(75) Inventors: Katsuhiko Nisitani; Kazumi Unno; Masayuki Ishikawa, all of Kanagawa-ken; Ryo Saeki, Chiba-ken; Takafumi Nakamura; Masanobu Iwamoto, both of Fukuoka-ken, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/993,574

(22) Filed: Dec. 18, 1997

Related U.S. Application Data

(62) Division of application No. 08/611,460, filed on Apr. 11, 1996, now Pat. No. 5,732,098.

(30) Foreign Application Priority Data

Apr. 14, 1995 (JP) .................................. 7-089510

(51) Int. Cl.$^7$ ..................................................... H01S 3/19
(52) U.S. Cl. ................................ 372/45; 257/94; 257/97
(58) Field of Search .............................. 372/45, 43, 44; 257/94, 97, 12, 17, 183, 461, 95, 98

(56) References Cited

U.S. PATENT DOCUMENTS

| | | | |
|---|---|---|---|
| 4,910,743 | * 3/1990 | Ohba et al. | 372/45 |
| 4,941,146 | * 7/1990 | Kobayashi | 372/45 |
| 5,027,169 | * 6/1991 | Takahashi et al. | 357/17 |
| 5,153,889 | 10/1992 | Sugawara et al. | 372/45 |
| 5,321,712 | * 6/1994 | Itaya et al. | 372/43 |
| 5,410,159 | 4/1995 | Sugawara et al. | 372/45 |
| 5,413,951 | * 5/1995 | Ohori et al. | 437/61 |
| 5,442,203 | 8/1995 | Adomi et al. | 372/98 |
| 5,537,433 | 7/1996 | Watanabe | 372/45 |
| 5,539,239 | 7/1996 | Kawazu et al. | 372/45 |
| 5,544,185 | 8/1996 | Kadoiwa et al. | 372/45 |
| 5,545,903 | 8/1996 | Van Der Poel et al. | 372/45 |
| 5,555,271 | 9/1996 | Honda et al. | 372/45 |
| 5,563,422 | * 10/1996 | Nakamura et al. | 257/13 |
| 5,564,819 | 10/1996 | Yamaguchi | 362/241 |
| 5,568,499 | * 10/1996 | Lear | 372/45 |
| 5,574,743 | 11/1996 | Van Der Poel et al. | 372/45 |
| 5,585,649 | * 12/1996 | Ishikawa et al. | 257/94 |
| 5,592,501 | 1/1997 | Edmond et al. | 372/45 |
| 5,732,098 | * 3/1998 | Nisitani et al. | 372/45 |

FOREIGN PATENT DOCUMENTS 4-247676 * 9/1992 (JP) ........................................ 372/45

* cited by examiner

Primary Examiner—Rodney Bovernick
Assistant Examiner—Ellen E. Kim
(74) Attorney, Agent, or Firm—Finnegan, Henderson, Farabow, Garrett & Dunner, L.L.P.

(57) ABSTRACT

A semiconductor light emitting device has a double heterostructure. The device is composed of an active layer and clad layers that sandwich the active layer. At least one of the clad layers has a multilayer structure having at least two element layers. The Al mole fraction of an element layer, which is proximal to the active layer, of the multilayer structure is smaller than that of the other element layer thereof distal from the active layer. This arrangement improves the crystal quality of an interface between the active layer and the clad layer of multilayer structure and effectively confines carriers in the active layer.

23 Claims, 14 Drawing Sheets

LED DISPLAY DEVICE

This is a division of application Ser. No. 08/611,460, filed Apr. 11, 1996, now U.S. Pat. No. 5,732,098.

BACKGROUND OF THE INVENTION

1. Field of the Invention

The present invention relates to a high-power semiconductor light emitting diode (referred to hereinafter as "LED") display device, and particularly, to a LED display device having a LED matrix circuit for an outdoor/indoor display panel, a railway sign board, a traffic sign board, or a vehicle-mounted light.

2. Description of the Prior Art

Semiconductor light emitting devices such as LEDs and semiconductor lasers are manufactured according to a liquid-phase epitaxial growth (LPE) technique and a vapor-phase epitaxial (VPE) growth technique such as a metal organic chemical vapor deposition (MOCVD) technique. Any of the techniques forms a double hetero (DH) structure to confine carriers in an active layer serving as a light emitting layer and realize high brightness.

FIG. 1 is a sectional view showing an InGaAlP-based LED having a DH structure according to a prior art. Successively laminated on an $n^+$-type GaAs substrate 1 are an n-type GaAs buffer layer 2, an n-type $In_{0.5}Al_{0.5}P/GaAs$ reflection layer (quarter-wave stack mirror) 3, an n-type $In_{0.5}(Ga_{1-x}Al_x)_{0.5}P$ clad layer 41, an undoped $In_{0.5}(Ga_{1-y}Al_y)_{0.5}P$ active layer 61, and a p-type $In_{0.5}(Ga_{1-x}Al_x)_{0.5}P$ clad layer 81. Here, $x \leq 1$ and $x > y$.

On a part of the clad layer 81, an n-type GaAs current block layer 91 is formed. On the current block layer 91 and clad layer 81, a p-type $Ga_{0.3}Al_{0.7}As$ current diffusion layer 10 is formed. On a part of the current diffusion layer 10, a $p^+$-type GaAs contact layer 11 is formed. On the contact layer 11, a p-type electrode 13 is formed. On the bottom surface of the substrate 1, an n-type electrode 12 is formed.

The structure of FIG. 1 is epitaxially grown according to a low pressure MOCVD (LPMOCVD) technique that employs trimethylindium (TMI), trimethylgallium (TMG), and trimethylaluminum (TMA) as materials of group III, arsine ($AsH_3$) and phosphine ($PH_3$) as materials of group V, silane ($SiH_4$) and dimethylzinc (DMZ) as doping materials, and hydrogen as a carrier gas. These materials epitaxially grow crystals under a low pressure. More precisely, a wafer having an n-type GaAs substrate 1 is placed in a CVD reactor and is kept at a given pressure and temperature. A mass flow controller supplies the group III, V, and doping materials into the reactor at set flow rates, to epitaxially grow layers one after another on the substrate 1. Namely, an n-type GaAs buffer layer 2, an n-type $In_{0.5}Al_{0.5}P/GaAs$ reflection layer 3, an n-type $In_{0.5}(Ga_{1-x}Al_x)_{0.5}P$ clad layer 41, an undoped $In_{0.5}(Ga_{1-y}Al_y)_{0.5}P$ active layer 61, a p-type $In_{0.5}(Ga_{1-x}Al_x)_{0.5}P$ clad layer 81, and an n-type GaAs current block layer 91 are successively formed on the substrate 1. Here, $x \leq 1$ and $x > y$.

The wafer with the layers is taken out of the reactor, and the current block layer 91 is selectively etched according to a photolithography technique into the shape of FIG. 1. The MOCVD method is again employed to form a p-type $Ga_{0.3}Al_{0.7}As$ current diffusion layer 10 and a p--type GaAs contact layer 11.

Au-based material is deposited on each surface of the wafer according to a vacuum evaporation technique. The Au-based layer is selectively etched according to the photolithography technique to form a p-type electrode 13 as shown in FIG. 1. The contact layer 11 is selectively etched to partly expose the current diffusion layer 10. An n-type electrode 12 is formed over the bottom surface of the substrate 1. The wafer Is diced into chips that serve each as the semiconductor light emitting device of FIG. 1. Each chip is mounted on a stem, bonded, sealed with resin, and fabricated into a $\phi$ 5-mm lamp.

FIG. 2 is a graph showing the initial brightness $I_o$ and remnant brightness ratio $\eta$ of the $\phi$ 5-mm lamp. The remnant brightness ratio is the ratio of the brightness $I_{1000}$ of the lamp measured after 1000 hours of operation at 50 mA to the initial brightness $I_o$. Namely, $\eta = (I_{1000}/I_o) \times 100$. Here, the mole fraction "y" of Al of the active layer 61 is 0.3, and the mole fraction "x" of Al of each of the clad layers 41 and 81 is changed among 1.0, 0.9, 0.8, and 0.7.

When the Al mole fraction "x" of $In_{0.5}(Ga_{1-x}Al_x)_{0.5}P$ of the clad layers 41 and 81 is increased, the initial brightness $I_o$ increases but the remnant brightness ratio $\eta$ decreases. When the Al mole fraction "x" is decreased, the initial brightness $I_o$ decreases but the remnant brightness ratio $\eta$ increases. In this way, the initial brightness $I_o$ and remnant brightness ratio $\eta$ are trade-offs. It is difficult for the conventional DH structure to provide high brightness as well as long service life.

FIG. 3 shows an InGaAlP-based LED having a DH structure according to another prior art. Sequentially laminated on an $n^+$type GaAs substrate 1 are an n-type GaAs buffer layer 2, an n-type $In_{0.5}Al_{0.5}P/GaAs$ reflective multilayer 3, an n-type $In_{0.5}Al_{0.5}P$ clad layer 42, an n-type $In_{0.5}(Ga_{0.72}Al_{0.28})_{0.5}P$ active layer 62, a p-type $In_{0.5}Al_{0.5}P$ clad layer 82, a p-type $In_{0.5}Ga_{0.5}P$ contact layer 127, and a p-type GaAs protection layer 128. On a part of the protection layer 128, there are sequentially laminated an n-type $In_{0.5}(Ga_{0.3}Al_{0.7})_{0.5}P$ current block layer 92, an n-type GaAs protection layer 93, a p-type $Ga_{0.3}Al_{0.7}As$ current diffusion layer 10, a p-type $In_{0.5}(Ga_{0.7}Al_{0.3})_{0.5}P$ diffusion layer 132, and a $p^+$-type GaAs contact layer 11. The contact layer 11 is formed on a part of the diffusion layer 132. On the contact layer 11, a p-type electrode 13 is formed. An n-type electrode 12 is formed on the bottom surface of the substrate 1.

When designing the clad layers 42 and 82 that sandwich the active layer 62 serving as a light emitting layer, the following opposing factors must be considered:

(a) To confine a sufficient quantity of minority carriers in the active layer 62, the band gap (Eg) of the clad layers 42 and 82 must be properly larger than that of the active layer 62. Namely, the Al mole fraction "x" of the clad layers 42 and 82 must be large.

(b) Crystal defects that trap minority carriers must be minimized in each interface between the clad layers 42 and 82 and the active layer 62. Such defects, however, easily occur in the interfaces where the Al mole fraction of the clad layers 42 and 82 greatly differs from that of the active layer 62. To reduce the crystal defects, the Al mole fraction "x" of the clad layers 42 and 82 must be small.

When the Al mole fraction of the clad layers 42 and 82 greatly differs from that of the active layer 62 that emits yellow light, initial brightness may be high but there will be many crystal defects in each interface among the layers. As a result, normalized light intensity $P/P_o$ deteriorates in proportion to an operating time as shown in FIG. 4.

The Al mole fraction of the clad layers of the conventional DH structure LED must be high to provide high brightness when the LED is used outdoors. This, however, causes many crystal defects to shorten the service life of the LED. If the Al mole fraction of the clad layers is low to extend the service life of the LED, the light output of the LED will be low, and therefore, the brightness thereof will be improper for outdoor use. In this way, the light output and service life of the conventional LED are trade-offs.

The conventional DH structure semiconductor light emitting devices are incapable of simultaneously providing high brightness and long service life.

SUMMARY OF THE INVENTION

An object of the present invention is to provide a semiconductor light emitting device having a DH structure that realizes high brightness as well as long service life.

In order to accomplish the object, the present invention provides a semiconductor light emitting device having any one of DH structures of FIGS. 5 to 9 and 12A. An active layer 61 (26) emits light of a given wavelength and is sandwiched between p- and n-type clad layers whose forbidden band gap Egc is larger than that (Ega) of the active layer. The Al mole fraction of a clad layer proximal to the active layer is small, and that of a clad layer distal from the active layer is large. More precisely, at least one of the p- and n-type clad layers has a multilayer structure in which a layer proximal to the active layer has a lower Al mole fraction than that distal from the active layer. Namely, the clad layers 44 (46, 25) and 83 (85, 27) proximal to the active layer have a small forbidden band gap Egc1, and the clad layers 43 (45, 24) and 84 (86, 28) distal from the active layer have a larger forbidden band gap Egc2 than Egc1.

The clad layers according to the present invention are multi-element compound semiconductor layers containing Al, and the Al mole fraction and thickness of each of the clad layers are optimized to realize high brightness and long service life. The multiple clad layers are called the first, second, and the like layers starting from the one closest to the active layer.

In FIG. 5, an active layer 61 is sandwiched between a first n-type clad layer 44 and a first p-type clad layer 83, and these layers 61, 44, and 83 are sandwiched between a second n-type clad layer 43 and a second p-type clad layer 84. FIG. 6 shows a DH structure LED that has only two n-type clad layers 44 and 43. FIG. 7 shows a DH structure LED that has only two p-type clad layers 83 and 84. In FIG. 8, an active layer 26 is sandwiched between two n-type clad layers 25 and 24 and two p-type clad layers 27 and 28. In FIG. 9, an active layer 61 is sandwiched between two n-type clad layers 46 and 45 and two p-type clad layers 85 and 86. In each of these devices, the Al mole fractions and thicknesses of the first, second, and the like clad layers are optimized to improve the crystal quality of each interface between the clad layers and the active layer and effectively confine carriers in the active layer. In FIGS. 12A and 12B, the Al mole fraction of first clad layers 48 and 88 is gradually increased in proportion to the distance from an active layer 61.

When an active layer of $In_{0.5}(Ga_{1-x}Al_x)_{0.5}P$ is employed, the Al mole fraction "y" of $In_{0.5}(Ga_{1-y}Al_y)_{0.5}P$ of first p- and n-type clad layers is set as follows:

$$x+0.1 \leq y \leq x+0.5 \tag{1}$$

In this case, the thickness of each first clad layer is in the range of 0.005 to 0.1 $\mu$m.

This structure improves the crystal qualities of each interface between the active layer and the clad layers, to effectively confine carriers in the active layer and realize high brightness and long service life.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 12B is a graph showing a change in the Al mole fraction of a first clad layer of the device of FIG. 12A;

DETAILED DESCRIPTION OF THE EMBODIMENTS

Figure 1:
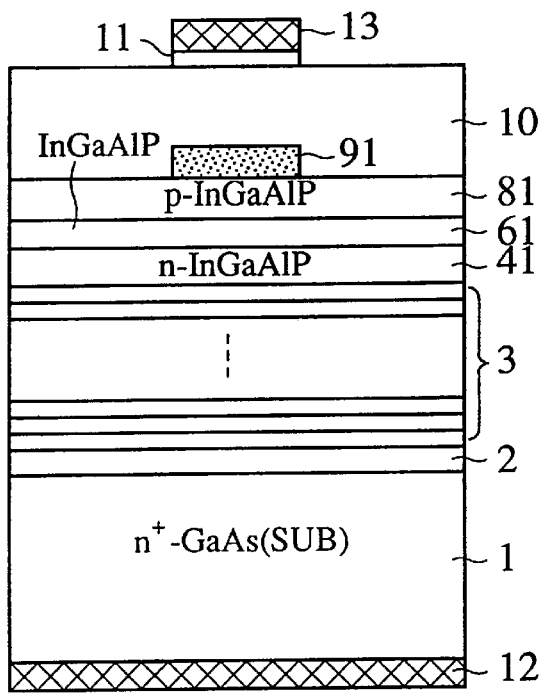
FIG. 1 is a sectional view showing a semiconductor light emitting device having a DH structure according to a prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor light emitting devices, it will be appreciated that the various drawings are not drawn to scale from one figure to another nor inside a given figure, and in particular that the layer thicknesses are arbitrarily drawn for facilitating the reading of the drawings.

(First embodiment)

Figure 5:
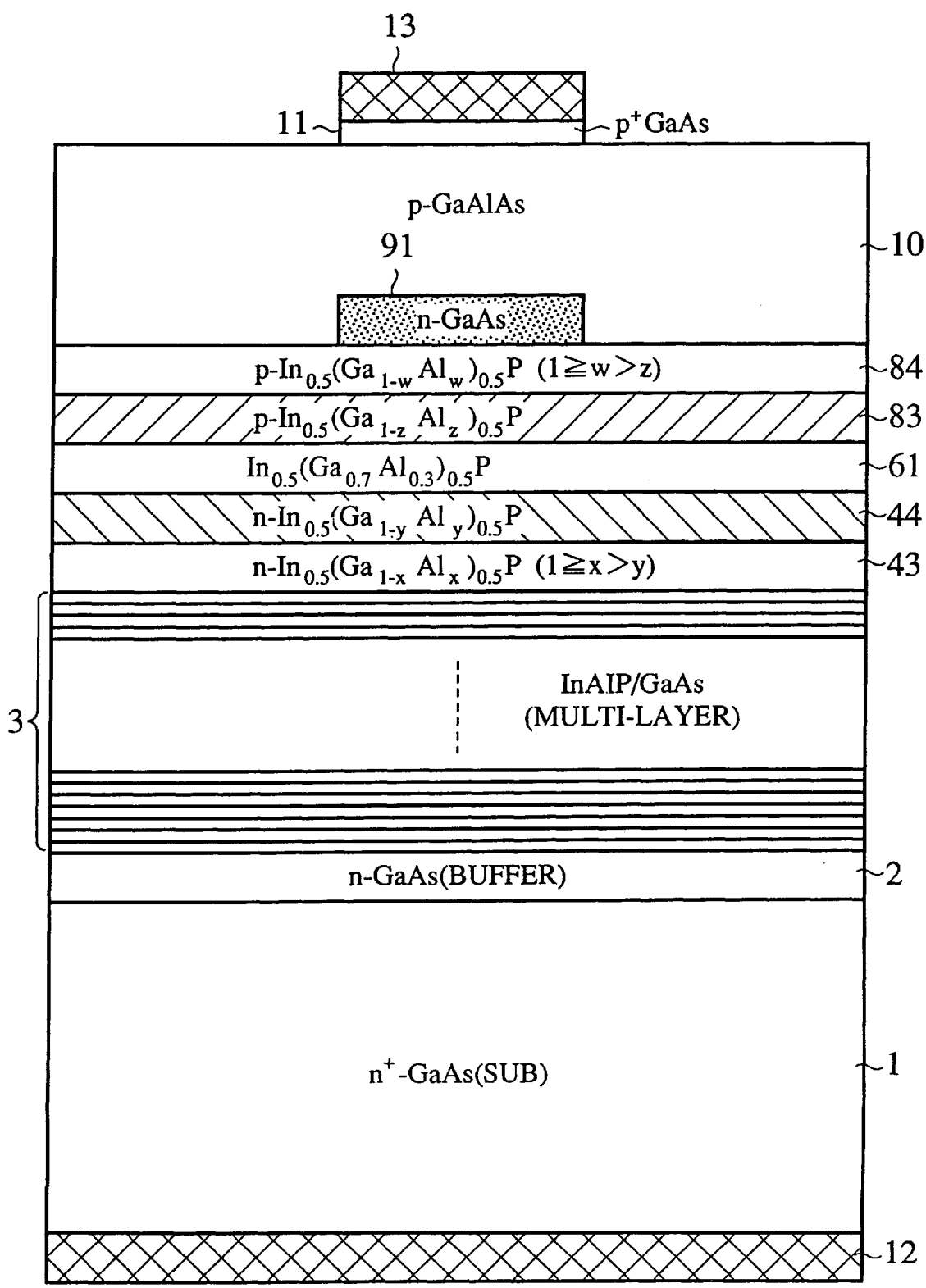
FIG. 5 is a sectional view showing a semiconductor light emitting device according to a first embodiment of the present invention.

FIG. 5 is a sectional view showing a DH structure light emitting diode (DH-LED) according to the first embodiment of the present invention. Sequentially formed on an n-type GaAs substrate 1 are an n-type GaAs buffer layer 2, an n-type InAlP/GaAs reflection layer 3, a second n-type InGaAlP clad layer 43, a first n-type InGaAlP clad layer 44, an undoped InGaAlP active layer 61, a first p-type InGaAlP clad layer 83, and a second p-type InGaAlP clad layer 84. On a part of the clad layer 84, an n-type GaAs current block layer 91 is formed. On the current block layer 91, there are formed a p-type GaAlAs current diffusion layer 10 and a p-type GaAs contact layer 11. The reflection layer 3 is a Bragg mirror having a multilayer structure composed of alternating 10 to 20 pairs of n-type InAlP and n-type GaAs layers each of $\lambda \times (1/4n)$ thick, where $\lambda$ is the wavelength of light emitted from the active layer 61 and n is a refractive index of the material of the reflection layer 3. The reflection layer 3 reflects light that goes toward the substrate 1 from the active layer 61, so that the light effectively runs only toward the current diffusion layer 10.

The Al mole fraction of each of the clad layers 44, 43, 83, and 94 and current diffusion layer 10 is determined to sufficiently transmit the light from the active layer 61. On the bottom surface of the substrate 1, an n-type electrode 12 is formed from, for example, Au—Ge alloy. On the contact layer 11, a p-type electrode 13 is formed from, for example, Au—Zn alloy. As is apparent in FIG. 5, the DH-LED of the first embodiment has two clad layers on each side of the active layer 61 so that the forbidden band gap Egc of the clad layers increases step by step in proportion to the distance from the active layer 61.

The Al mole fraction "x" of the second n-type $In_{0.5}(Ga_{1-x}Al_x)_{0.5}P$ clad layer 43 is 1.0, the Al mole fraction "y" of the first n-type $In_{0.5}(Ga_{1-y}Al_y)_{0.5}P$ clad layer 44 is 0.7, the Al mole fraction "z" of the first p-type $In_{0.5}(Ga_{1-z}Al_z)_{0.5}P$ clad layer 83 is 0.7, and the Al mole fraction "w" of the second p-type $In_{0.5}(Ga_{1-w}Al_w)_{0.5}P$ clad layer 84 is 1.0. In this way, the Al mole fractions of the clad layers are changed step by step.

Figure 2:
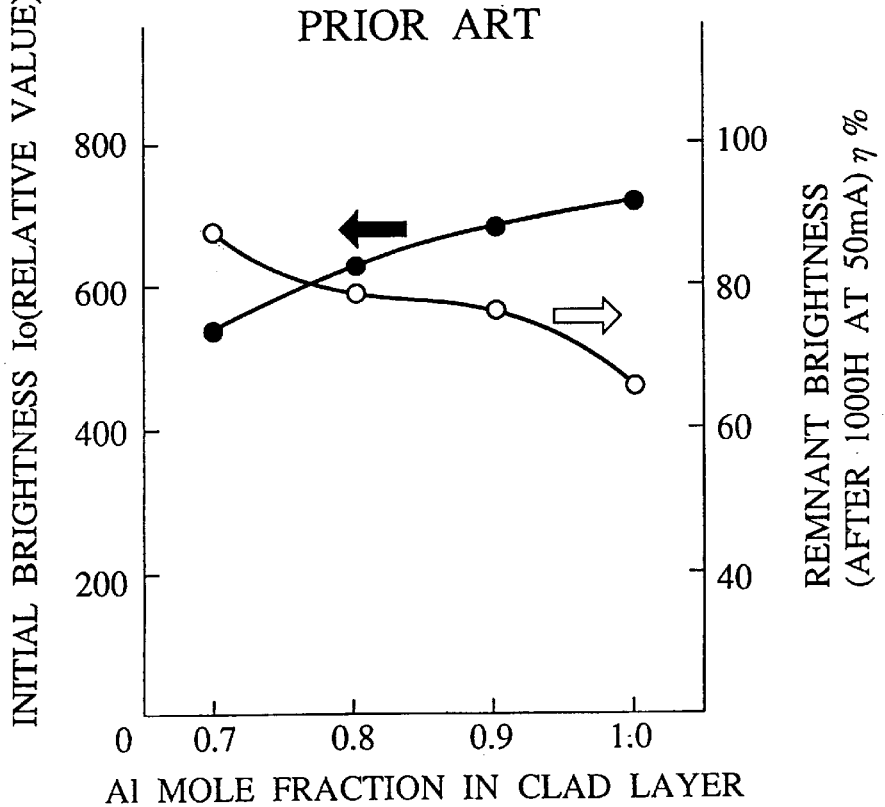
FIG. 2 is a graph showing the Al mole fractions of clad layers, initial brightness, and remnant brightness of the device of FIG. 1.
Figure 3:
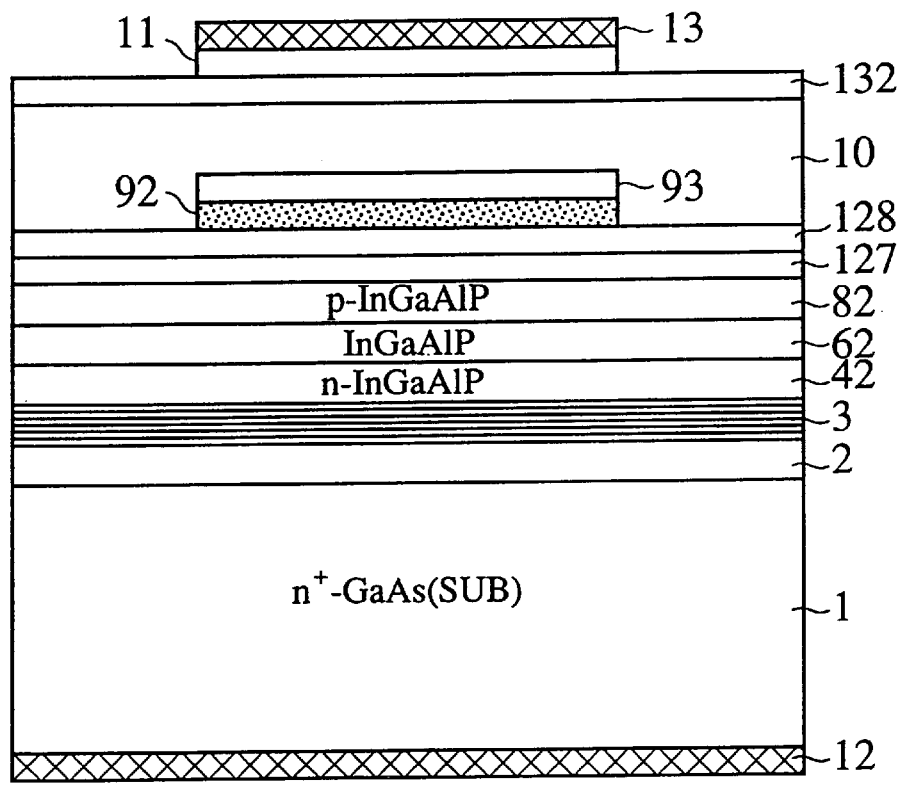
FIG. 3 is a sectional view showing a semiconductor light emitting device having a DH structure according to another prior art.

The DH-LED of FIG. 5 is mounted on a stem, bonded, and sealed with resin, to form a φ5-mm lamp. The initial brightness $I_o$ of this lamp is equal to the highest level (a relative value of 750) of the prior art of FIG. 2, and the remnant brightness ratio ($\eta = I_{1000}/I_o$) of brightness $I_{1000}$ after 1000 hours of operation at 50 mA is 85%, which is far greater than that of the prior art.

The high quality of the DH-LED of FIG. 5 is derived from the two clad layers on each side of the active layer 61, with the Al mole fraction of the first clad layers 44 and 83 proximal to the active layer 61 being low to improve the crystal quality of each interface between the active layer 61 and the first clad layers, and with the Al mole fraction of the second clad layers 43 and 84 distal from the active layer 61 being high to effectively confine carriers in the active layer 61. As a result, the DH-LED of the first embodiment provides higher brightness and longer service life than the prior art.

The processes of manufacturing the DH-LED of the first embodiment will be explained.

a) Firstly prepared is an n-type GaAs substrate I having an impurity concentration of $0.4 \times 10^{18}$ cm$^{-3}$ to $4 \times 10^{18}$ cm$^3$ and a (100) plane shifted toward [011] by several degrees. On the substrate 1, an n-type GaAs buffer layer 2 of about 0.5 µm thick having an impurity concentration $N=4 \times 10^{17}$ cm$^{-3}$ is formed. On the buffer layer 2, a reflection layer 3 is formed by alternately growing 10 to 20 pairs of n-type $In_{0.5}Al_{0.5}P$ film ($N=4 \times 10^{17}$ cm$^{-3}$) and GaAs film ($N=4 \times 10^{17}$ cm$^{-3}$) of $\lambda/4n$ thick. Sequentially grown on the reflection layer 3 are a second n-type $In_{0.5}(Ga_{1-x}Al_x)_{0.5}P$ clad layer 43 ($N=4 \times 10^{17}$ cm$^{-3}$, x=1.0) of about 0.59 µm thick, a first n-type $In_{0.5}(Ga_{1-y}Al_y)_{0.5}P$ clad layer 44 ($N=4 \times 10^{17}$ cm$^{-3}$, y=0.7) of about 0.01 µm thick, an undoped $In_{0.5}(Ga_{0.7}Al_{0.3})_{0.5}P$ active layer 61 of about 0.6 µm thick, a first p-type $In_{0.5}(Ga_{1-z}Al_z)_{0.5}P$ clad layer 83 ($N=4 \times 10^{17}$ cm$^{-3}$, z=0.7) of about 0.01 µm thick, a second p-type $In_{0.5}(Ga_{1-w}Al_w)_{0.5}P$ clad layer 84 ($N=4 \times 10^{17}$ cm$^{-3}$ w=1.0) of about 0.59 µm thick, and an n-type GaAs current block layer 91 ($N=2 \times 10^{18}$ cm$^{-3}$) of about 0.02 µm thick.

The multilayer structure from the buffer layer 2 to the current block layer 91 is formed according to the LPMOCVD technique that employs trimethylindium (TMI), trimethylgallium (TMG), and trimethylaluminum (TMA) as materials of group III, arsine (AsH$_3$) and phosphine (PH$_3$) as materials of group V, and silane (SiH$_4$) and dimethylzinc (DMZ) as doping materials. More precisely, the substrate 1 is placed in a CVD reactor, which is set to a low pressure of 3.9 to 13 kPa. A hydrogen carrier gas is guided into the CVD reactor, and the substrate 1 is heated in the arsine gas atmosphere up to 600 to 800 degrees centigrade. The substrate 1 is kept at the temperature, and the surface thereof is cleaned. The group III, group V, and doping materials are properly selected depending on layers to be grown and are supplied at predetermined flow rates through valves and/or mass flow controllers, to epitaxially grow the buffer layer 2 up to the current block layer 91.

b) The wafer is picked out of the CVD reactor, and the current block layer 91 is patterned as shown in FIG. 5 according to the photolithography technique.

c) The wafer is again set in the CVD reactor, and the LPMOCVD technique is employed to form a p-type $Ga_{0.3}Al_{0.7}As$ current diffusion layer 10 ($N=2 \times 10^{18}$ cm$^{-3}$) of about 4.5 µm thick and a p-type GaAs contact layer 11 ($N=2 \times 10^{18}$ cm$^{-3}$) of about 0.1 ||m thick. The wafer is picked out of the CVD reactor.

d) Electrode material is deposited on each side of the wafer according to a vacuum evaporation or a sputtering technique. The photolithography technique is employed to form a p-type electrode 13 on the contact layer 11, and an n-type electrode 12 on the bottom surface of the substrate 1. The contact layer 11 is selectively removed according to the photolithography technique so that the contact layer 11 is left only under the electrode 13 and the current diffusion layer 10 is partly exposed.

e) The wafer is diced into individual chips that form each the DH-LED of FIG. 5.

(Example 1.1)

Various modifications will be possible based on the first embodiment. For example, the first n-type clad layer 44 and first p-type clad layer 83 are each about 0.05 µm thick, the second n-type clad layer 43 and second p-type clad layer 84 are each about 0.55 μm thick, and the other layers are the same as those of the first embodiment. This modification forms a φ 5-mm lamp that has an initial brightness $I_o$ of 710 (relative value) and a remnant brightness ratio n of 90% similar to the first embodiment.

(Example 1.2)

A second modification of the first embodiment employs different Al mole fractions. For example, the Al mole fractions "y" and "z" of the first n- and p-type clad layers 44 and 83 having the same thickness as that of the first embodiment are each 0.6. In this case, the initial brightness $I_o$ of a φ5-mm lamp to be formed is 725 (relative value) and the remnant brightness ratio η thereof is 100%. When the Al mole fractions "y" and "z" of the first clad layers 44 and 83 are each 0.8, the initial brightness $I_o$ of a φ 5-mm lamp to be formed is 720 (relative value) and the remnant brightness ratio η thereof is 95%. This modification realizes the maximum brightness level of the prior art and a remnant brightness ratio greater than the prior art.

(Second embodiment)

Figure 6:
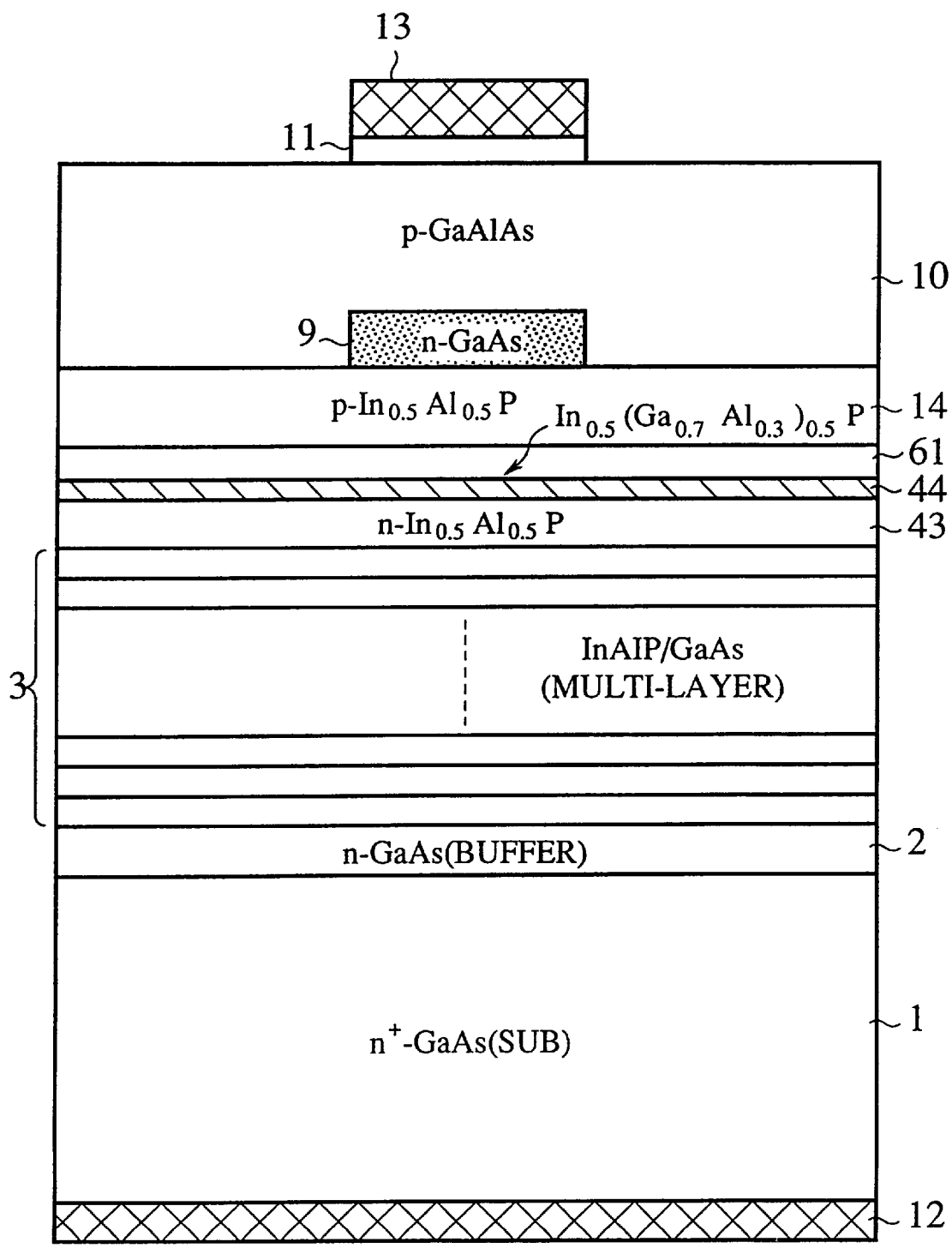
FIG. 6 is a sectional view showing a semiconductor light emitting device according to a second embodiment of the present invention.
Figure 7:
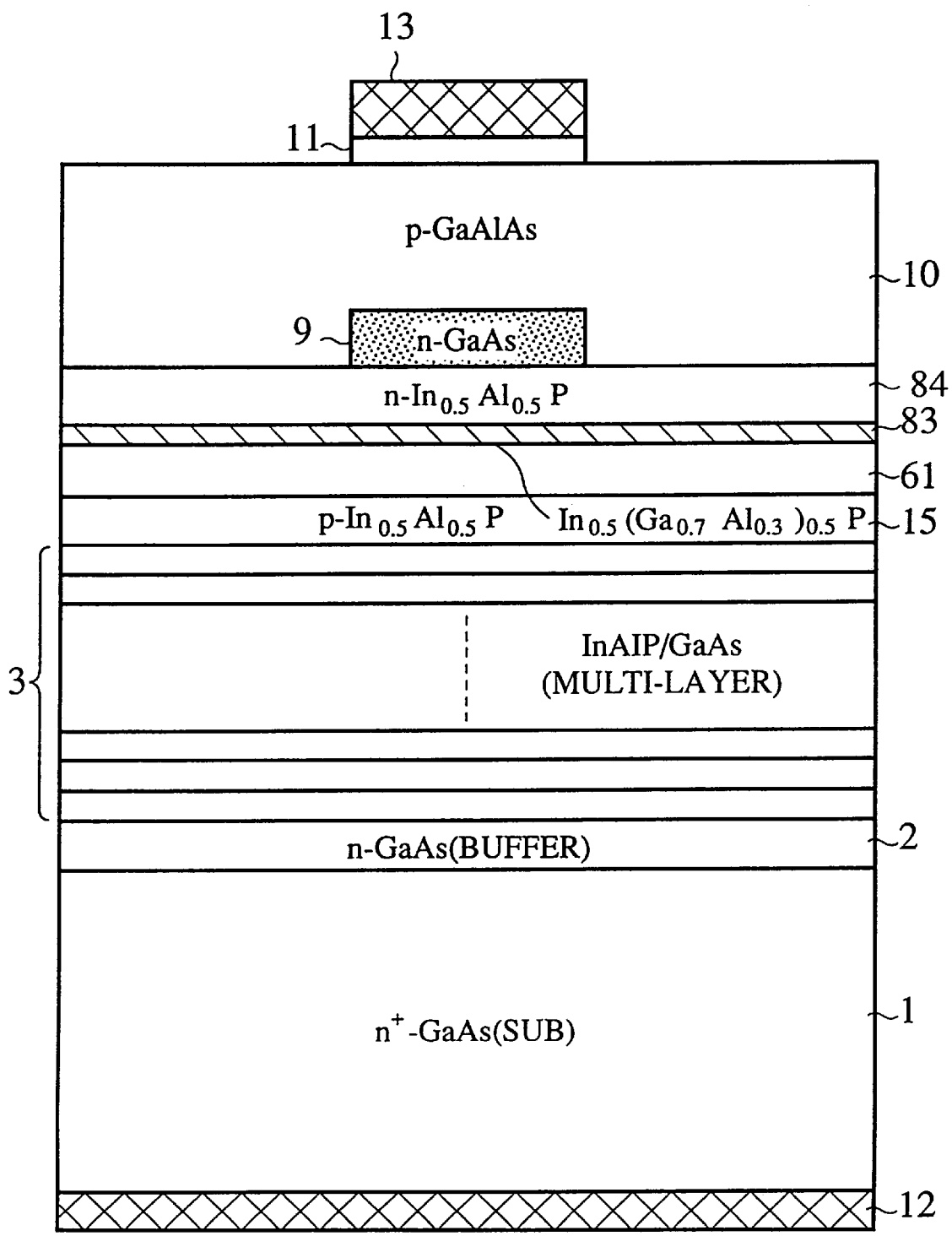
FIG. 7 is a sectional view showing a semiconductor light emitting device according to a modification of the second embodiment.

FIGS. 6 and 7 show DH-LEDs according to the second embodiment of the present invention. Unlike the first embodiment that forms two clad layers on each side of an active layer, the second embodiment forms two clad layers only on one side of an $In_{0.5}(Ga_{0.7}Al_{0.3})_{0.5}P$ active layer 61. With this structure, the second embodiment provides the same effect as the first embodiment.

In FIG. 6, a p-type $In_{0.5}Al_{0.5}P$ clad layer 14 of about 0.6 μm thick is formed on the p-type side of the active layer 61, and on the n-type side thereof, there are formed a first n-type $In_{0.5}(Ga_{0.3}Al_{0.7})_{0.5}P$ clad layer 44 of about 0.01 μm thick and a second n-type $In_{0.5}Al_{0.5}P$ clad layer 43 of about 0.59 μm thick.

In FIG. 7, an n-type clad layer 15 is formed on the n-type side of the active layer 61, and on the p-type side thereof, two p-type clad layers 83 and 84 are formed.

In this way, the second embodiment forms multiple clad layers only on one side of an active layer with the Al mole fraction of the multiple clad layers increasing in proportion to the distance from the active layer, to improve the crystal characteristics of an interface between them and effectively confine carriers in the active layer.

The semiconductor light emitting device of the second embodiment provides high brightness and long service life.

(Third embodiment)

Figure 8:
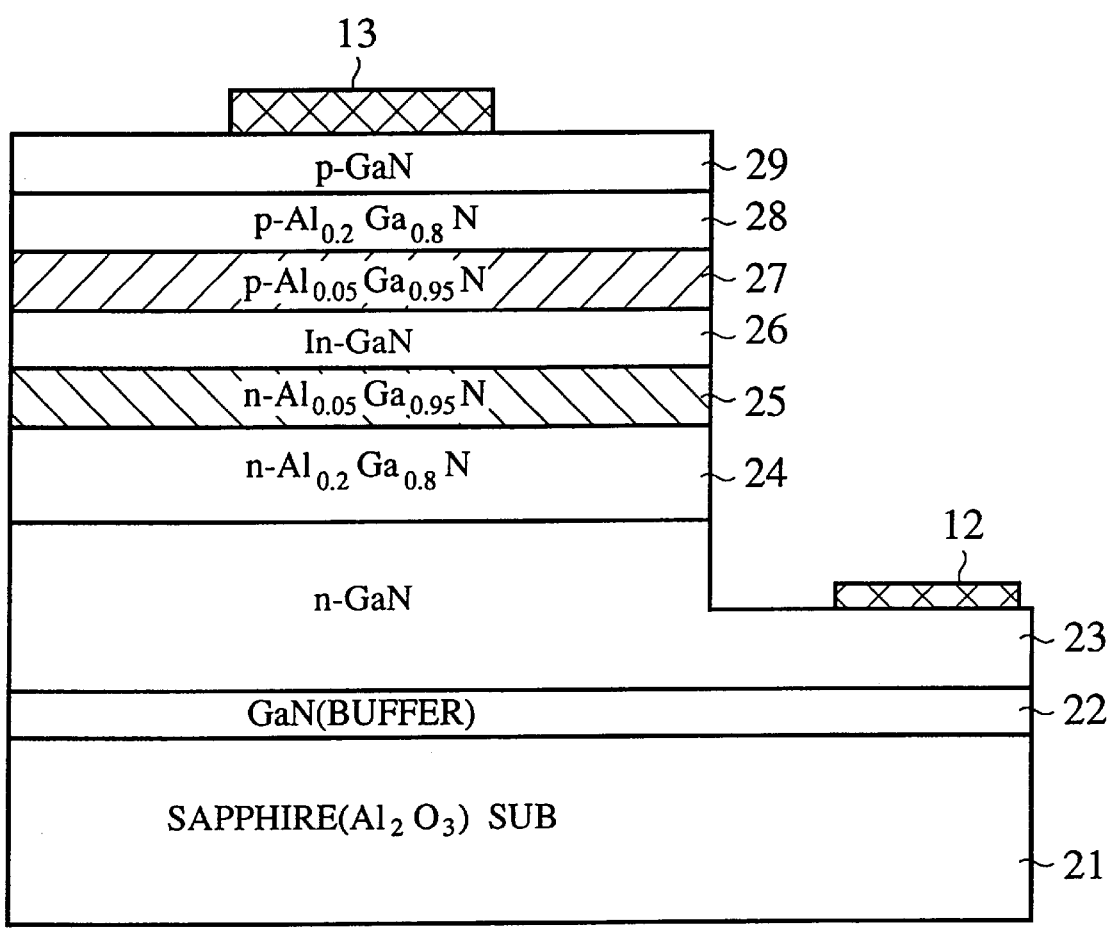
FIG. 8 is a sectional view showing a semiconductor light emitting device according to a third embodiment of the present invention.

FIG. 8 is a sectional view showing a DH-LED formed on a sapphire ($Al_2O_3$) substrate according to the third embodiment of the present invention. Successively formed on the sapphire substrate 21 are a GaN buffer layer 22, an n-type GaN layer 23, a second n-type $Al_{0.2}Ga_{0.8}N$ clad layer 24, a first n-type $Al_{0.05}Ga_{0.95}N$ clad layer 25, an InGaN active layer 26, a first p-type $Al_{0.05}Ga_{0.95}N$ clad layer 27, a second p-type $Al_{0.2}Ga_{0.8}N$ clad layer 28, and a p-type GaN layer 29. On a part of the layer 29, a p-type electrode 13 is formed. A U-shaped trench is formed through the layers 29, 28, 27, 26, 25, and 24 up to the layer 23. On the bottom of the U-shaped trench, an n-type electrode 12 is formed. The third embodiment provides the same effect as the first and second embodiments.

The active layer 26 serving as a light emitting layer is sandwiched between the clad layers with the Al mole fraction of the clad layers 25 and 27 proximal to the active layer 26 being lower than that of the clad layers 24 and 28 distal from the active layer 26. This structure improves the crystal quality of each interface between the active layer and the clad layers, to effectively confine carriers in the active layer 26. As a result, the light emitting device of the third embodiment provides high brightness and long service life.

Although the third embodiment forms two clad layers on each side of the active layer 26, the two clad layers may be formed only on one side of the active layer, to provide the same effect.

(Fourth embodiment)

Figure 9:
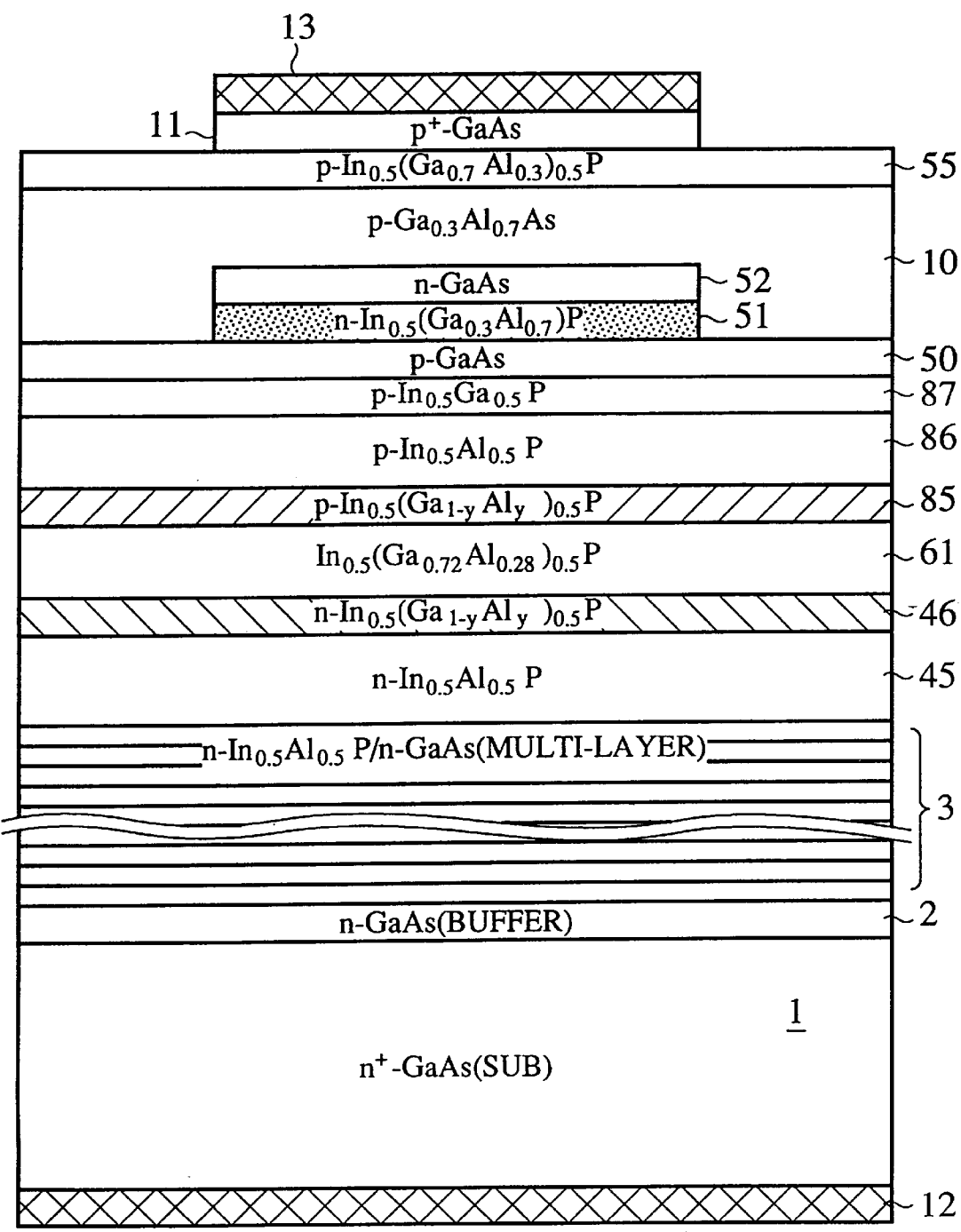
FIG. 9 is a sectional view showing a semiconductor light emitting device according to a fourth embodiment of the present invention.

FIG. 9 is a sectional view showing a DH-LED according to the fourth embodiment of the present invention. Similar to the first embodiment, the fourth embodiment forms each two p- and n-type clad layers. Namely, a first n-type $In_{0.5}(Ga_{1-y}Al_y)_{0.5}P$ clad layer 46 and a first p-type $In_{0.5}(Ga_{1-y}Al_y)_{0.5}P$ clad layer 85 are formed on opposite sides of an $In_{0.5}(Ga_{1-y}Al_y)_{0.5}P$ active layer 61 where $$x+0.1 \leq y \leq x+0.5$$

and a second n-type $In_{0.5}(Ga_{1-z}Al_z)_{0.5}P$ clad layer 45 and a second p-type $In_{0.5}(Ga_{1-z}Al_z)_{0.5}P$ clad layer 86 are formed outside the layers 46 and 85, respectively, where the Al mole fraction "z" is larger than "y." The thickness of each of the first clad layers 46 and 85 is in the range of 0.005 to 0.1 μm.

The Al mole fraction "x" of the active layer 61 may take 0, and the Al mole fraction "z" of the second clad layers may take 1. In the following explanation, the active layer is made of $In_{0.5}(Ga_{0.72}Al_{0.28})_{0.5}P$, and the second clad layers 45 and 86 are made of n-type $In_{0.5}Al_{0.5}P$ and p-type $In_{0.5}Al_{0.5}P$, respectively. The present invention, however, is not limited to these compounds.

The DH-LED of FIG. 9 employs an n-type GaAs substrate 1 having an impurity concentration of $0.4 \times 10^{18}$ to $3 \times 10^{18}$ cm$^{-1}$. Successively formed on the substrate 1 are an n-type GaAs buffer layer 2, a reflection layer 3 composed of 10 pairs of alternating n-type $In_{0.5}Al_{0.5}P$ film and n-type GaAs film, the second n-type $In_{0.5}Al_{0.5}P$ clad layer 45, the first n-type $In_{0.5}(Ga_{0.4}Al_{0.6})_{0.5}P$ clad layer 46, the undoped n-type $In_{0.5}(Ga_{0.72}Al_{0.28})_{0.5}P$ active layer 61, the first p-type $In_{0.5}(Ga_{0.4}Al_{0.6})_{0.5}P$ clad layer 85, the second p-type $In_{0.5}Al_{0.5}P$ clad layer 86, a p-type $In_{0.5}Ga_{0.6}P$ contact layer 87, a p-type GaAs protection 15 layer 50, an n-type $In_{0.5}(Ga_{0.3}Al_{0.7})_{0.5}P$ current block layer 51, an n-type GaAs protection layer 52, a p-type $Ga_{0.3}Al_{0.7}As$ current diffusion layer 10, a p-type $In_{0.5}(Ga_{0.7}Al_{0.3})_{0.5}P$ moisture resistant layer 55, and a p-type GaAs contact layer 11. On the contact layer 11, a p-type electrode 13 is formed from Au—Zn. Over the bottom surface of the substrate 1, an n-type electrode 12 is formed from Au-Ge. The electrode 13 and contact layer 11 are each of about 140 μm in diameter and are formed at the center of the moisture resistant layer 55. The surface of the moisture resistant layer 55 except the part where the electrode 13 is formed emanates light from the active layer 61.

Figure 4:
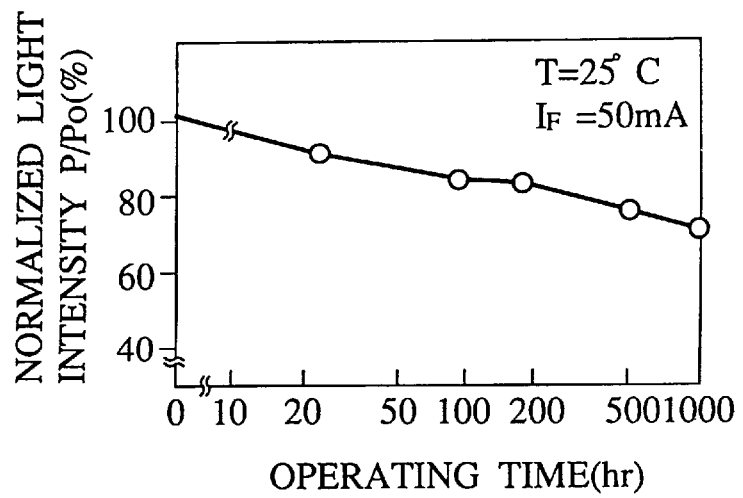
FIG. 4 is a graph showing the operating time of the device of FIG. 3.
Figure 10A:
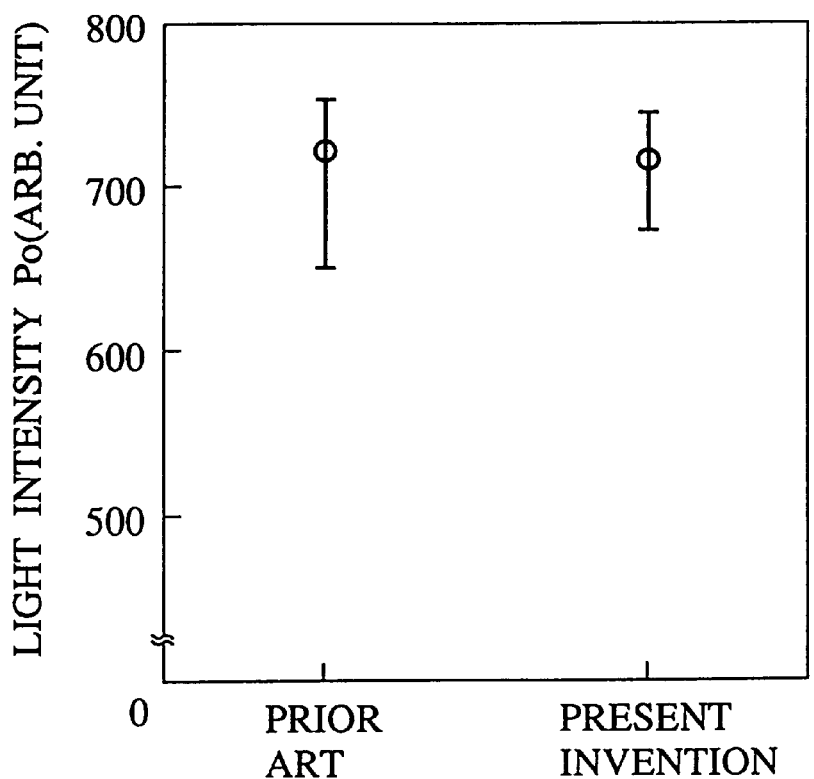
FIG. 10A is a graph showing a comparison between the light output of the device of the fourth embodiment and that of the prior art of FIG. 3.
Figure 10B:
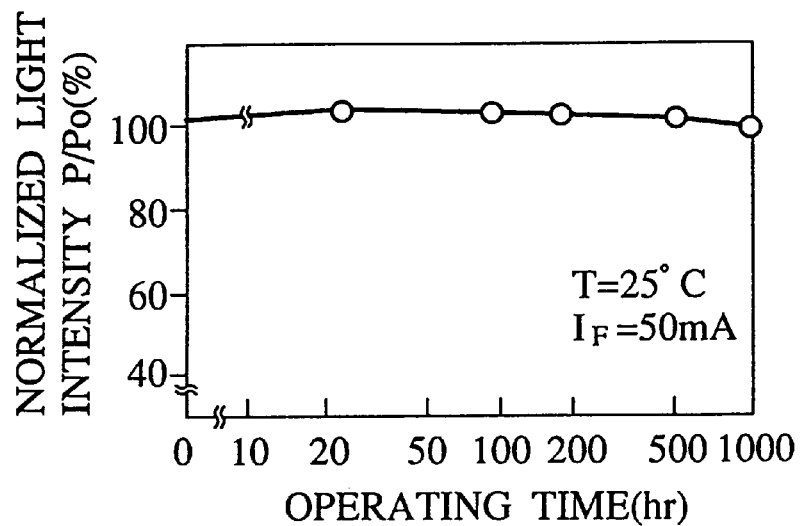
FIG. 10B is a graph showing the operating time of the device of FIG. 9.

The active layer 61 serving as a light emitting layer is indirectly in contact with the second n- and p-type clad layers 45 and 86 whose Al mole fractions are greatly differ from that of the active layer 61, with the first n- and p-type clad layers 46 and 85 being interposed between them. Here, the Al mole fraction "y" of the first clad layers 46 and 85 and the Al mole fraction "x" of the active layer 61 are designed as "$x+0.1 \leq y \leq x+0.5$" and the thickness of each of the first clad layers 46 and 85 is in the range of 0.005 to 0.1 μm. This structure improves the crystal quality of each interface between the active layer 61 and the clad layers. Accordingly, the DH-LED of the fourth embodiment maintains an initial brightness level equivalent to that of the prior art whose service life is short as shown in FIG. 10A, and secures longer service life as shown in FIG. 10B than the prior art of FIG. 4.

The processes of manufacturing the DH-LED of the fourth embodiment will be explained with reference to FIGS. 11A to 11E.

Figure 11A:
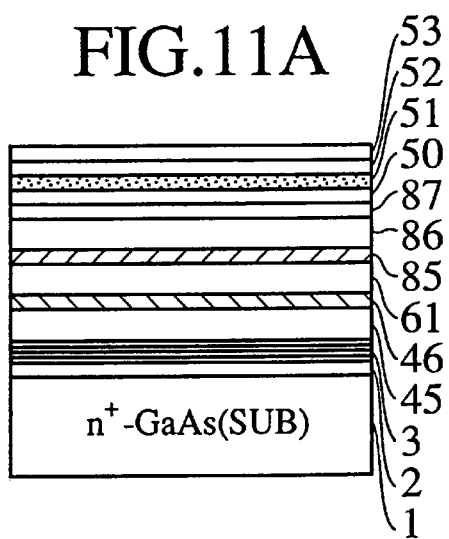
FIGS. 11A to 11E are sectional views showing the processes of manufacturing the device of FIG. 9.

(a) In FIG. 11A, the LPMOCVD technique is used to successively form on an n-type GaAs substrate 1 an Si-doped n-type GaAs buffer layer 2 of about 0.5 μm thick with an impurity concentration N of 2.0 to 5.0×$10^{17}$ cm$^{-3}$, a reflection layer 3 composed of 10 pairs of alternating Si-doped n-type $In_{0.5}Al_{0.5}P$ film (N=0.4 to 2.0×$10^{18}$ cm$^{-3}$) of about 40 nm thick and Si-doped n-type GaAs film (N=0.4 to 2.0×$10^{18}$ cm$^{-3}$) of about 40 nm thick, an Si-doped second n-type $In_{0.5}Al_{0.5}P$ clad layer 45 (N=2.0 to 6.0×$10^{17}$) of about 0.6 μm thick, an Si-doped first n-type $In_{0.5}(Ga_{0.4}Al_{0.6})_{0.5}P$ clad layer 46 of about 0.05 μm thick, an undoped n-type $In_{0.5}(Ga_{0.72}Al_{0.28})_{0.5}P$ active layer 61 (N is approximately 1.0×$10^{17}$ cm$^{-3}$) of about 0.6 μm thick, a Zn-doped first p-type $In_{0.5}(Ga_{0.4}Al_{0.6})_{0.5}P$ clad layer 85 of about 0.05 μm thick, a Zn-doped second p-type $In_{0.5}Al_{0.5}P$ clad layer 86 (N=2.0 to 6.1×$10^{17}$ cm$^{-3}$) of about 0.6 μm thick, a Zn-doped p-type $In_{0.5}Ga_{0.5}P$ contact layer 87 (N=0.5 to 1.0×$10^{18}$ cm$^{-3}$) of about 0.02 μm thick, a Zn-doped p-type GaAs protection layer 50 (N=1.0 to 6.0×$10^{18}$ cm$^{-3}$) of about 0.01 μm thick, an Si-doped n-type $In_{0.5}(Ga_{0.3}Al_{0.7})_{0.5}P$ current block layer 51 (N=0.5 to 1.0×$10^{19}$ cm$^{-3}$) of about 0.02 μm thick, an Si-doped n-type GaAs protection layer 52 (N=1.0 to 6.0×$10^{18}$ cm$^{-3}$) of about 0.01 μm thick, and an Si-doped n-type $In_{0.5}(Ga_{0.3}Al_{0.7})_{0.5}P$ cap layer 53 (N=1.0 to 6.0×$10^{18}$ cm$^{-3}$) of about 0.02 μm thick.

Figure 11B:
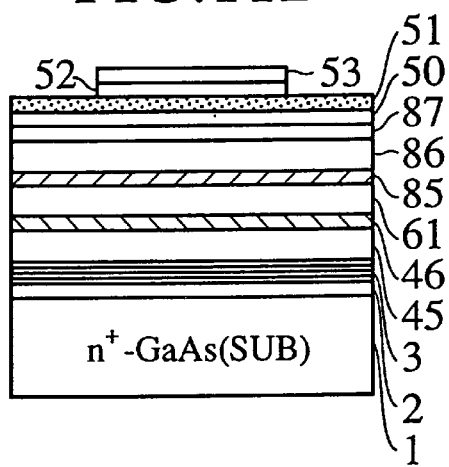

(b) In FIG. 11B, the cap layer 53 and protection layer 52 are selectively etched into a required shape to partly expose the current block layer 51 according to a wet etching technique.

Figure 11C:
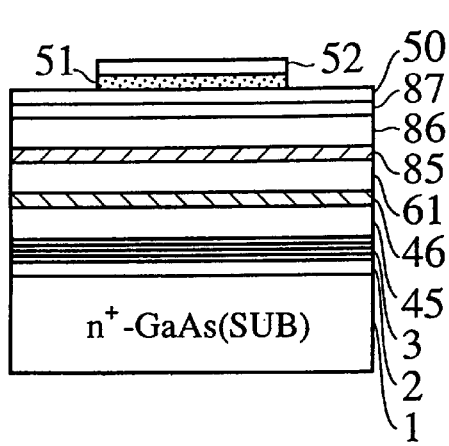

(c) In FIG. 11C, the cap layer 53 and the current block layer 51 are etched according to the wet etching technique, to partly expose the protection layer 50.

Figure 11D:
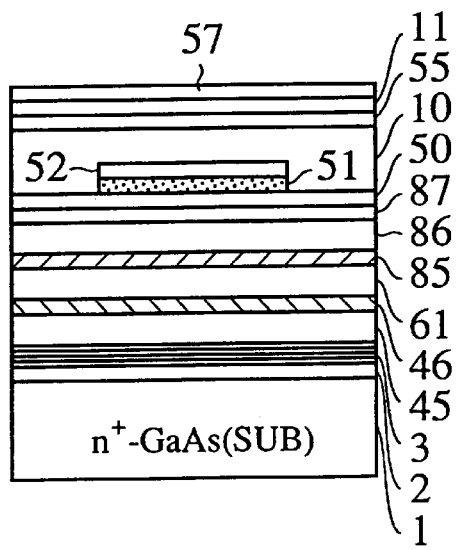

(d) In FIG. 11D, the LPMOCVD technique is used to sequentially form on the wafer of FIG. 11C a Zn-doped p-type $Ga_{0.3}Al_{0.7}As$ current diffusion layer 10 (N=1.0 to 6.0×$10^{18}$ cm$^{-3}$) of about 4.5 μm thick, a Zn-doped p-type $In_{0.5}(Ga_{0.7}Al_{0.3})_{0.5}P$ moisture resistant layer 55 (N=0.5 to 2.0×$10^{18}$ cm$^{-3}$) of about 0.1 μm thick, a Zn-doped p-type GaAs contact layer 11 (N=1.0 to 6.0×$10^{18}$ cm$^{-3}$) of about 0.1 μm thick, and an Si-doped n-type $In_{0.5}(Ga_{0.3}Al_{0.7})_{0.5}P$ cap layer 57 (N=1.0 to 6.0×$10^{18}$ cm$^{-3}$) of about 0.15 μm thick.

Figure 11E:
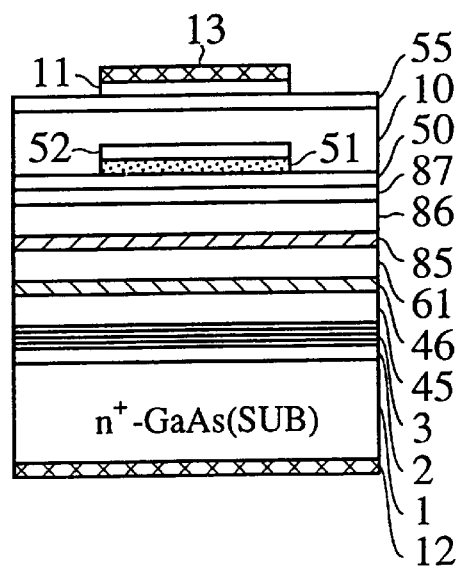

(e) In FIG. 11E, the bottom surface of the substrate 1 is removed by 5 μm according to the wet etching technique. The cap layer 57 is entirely removed according to the wet etching technique. An n-type electrode 12 is formed from Au-Ge on the bottom surface of the substrate 1. A p-type electrode 13 of about 140 μm in diameter is formed from Au-Zn on the contact layer 11 Just above the current block layer 51. Exposed part of the contact layer 11 is removed according to the wet etching technique. The wafer is diced by blade dicing into chips each having a side length of about 320 μm. Damaged (or broken) layers on each side face of the chip caused by the blade dicing are removed according to the wet etching technique, to complete each light emitting device.

The structures, materials, and dimensions mentioned above are only examples. The first clad layers 46 and 85 of FIG. 9 may have the following thicknesses and Al mole fractions to provide the same effect:

(a) The first n-type clad layer 46 is an Si-doped n-type $In_{0.5}(Ga_{0.2}Al_{0.2})_{0.5}P$ layer of about 0.05 μm thick, and the first p-type clad layer 85 is a Zn-doped p-type $In_{0.5}(Ga_{0.2}Al_{0.6})_{0.5}P$ layer of about 0.05 μm thick.

(b) The first n-type clad layer 46 Is an Si-doped n-type $In_{0.5}(Ga_{0.4}Al_{0.6})_{0.5}P$ layer of about 0.01 μm thick, and the first p-type clad layer 85 is a Zn-doped p-type $In_{0.5}(Ga_{0.4}Al_{0.6})_{0.5}P$ layer of about 0.01 μm thick.

(c) The first n-type clad layer 46 is an Si-doped n-type $In_{0.5}(Ga_{0.2}Al_{0.8})_{0.5}P$ layer of about 0.10 μm thick, and the first p-type clad layer 85 is a Zn-doped p-type $In_{0.5}(Ga_{0.2}Al_{0.8})_{0.5}P$ layer of about 0.10 μm thick.

Even if one of the first clad layers 85 and 46 is omitted, the effect of the present invention will be secured. For example, the following are possible:

(d) Only the first n-type clad layer 46 of about 0.05 μm thick is formed from Si-doped n-type $In_{0.5}(Ga_{0.4}Al_{0.6})_{0.5}P$.

(e) Only the first p-type clad layer 85 of about 0.05 μm thick is formed from Zn-doped p-type $In_{0.5}(Ga_{0.4}Al_{0.6})_{0.5}P$.

(Fifth embodiment)

Figures 12, 12A:
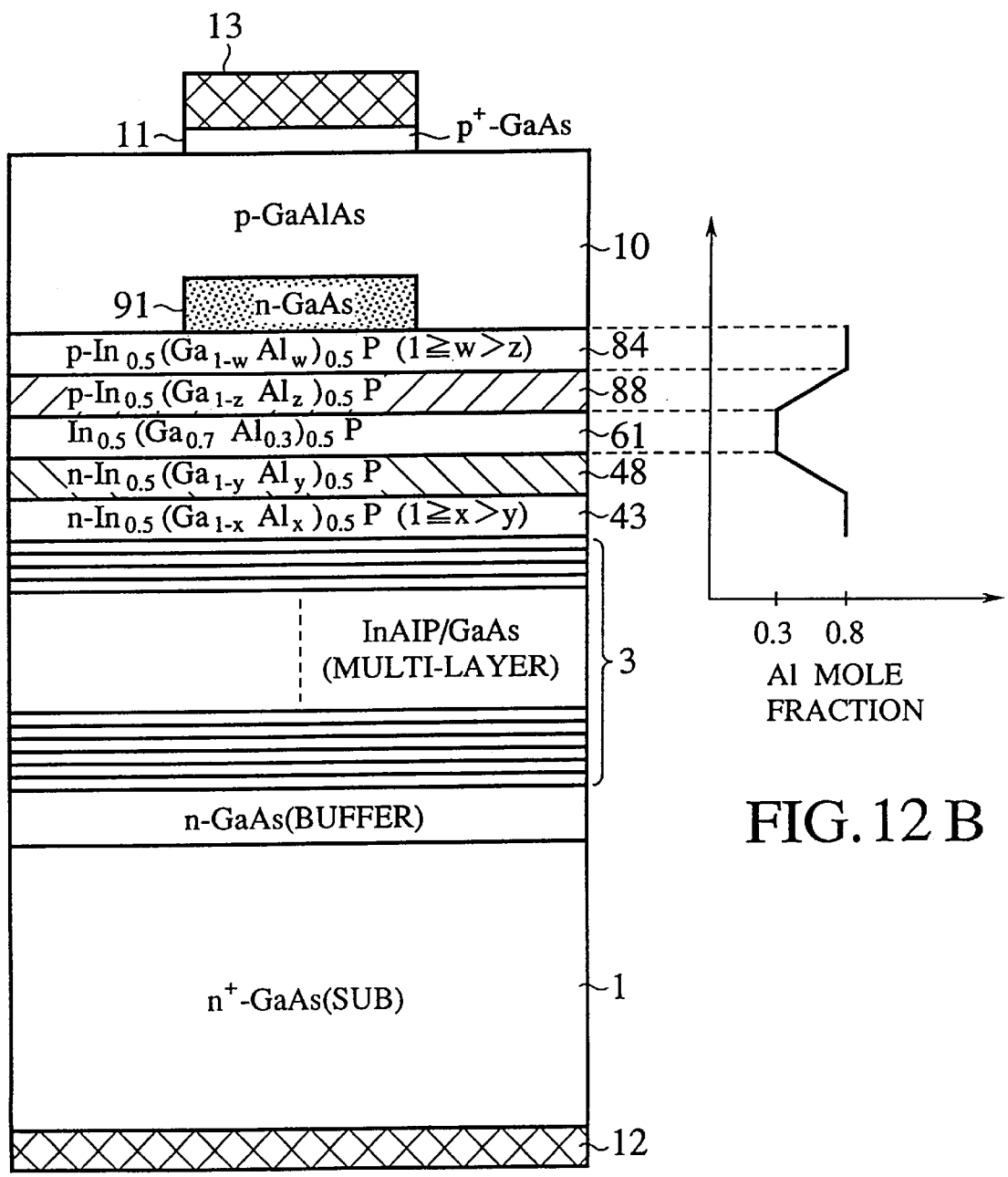
FIG. 12A is a sectional view showing a semiconductor light emitting device according to a fifth embodiment of the present invention.

FIGS. 12A and 12B show a DH-LED according to the fifth embodiment of the present invention. This embodiment gradually increases the Al mole fraction of a first clad layer. Sequentially formed on an n-type GaAs substrate 1 are an n-type GaAs buffer layer 2, an n-type InAlP/GaAs reflection layer 3, a second n-type InGaAlP clad layer 43, a first n-type InGaAlP clad layer 48, an undoped InGaAlP active layer 61, a first p-type InGaAlP clad layer 88, and a second p-type InGaAlP clad layer 84. On a part of the second clad layer 84, an n-type GaAs current block layer 91 is formed. On the current block layer 91, a p-type GaAlAs current diffusion layer 10 and a p$^+$-type GaAs contact layer 11 are formed. The reflection layer 3 has a multilayer structure composed of 10 to 20 pairs of alternating n-type InAlP layer and n-type GaAs layer having a thickness of λ×¼ n where λ is the wavelength of light emitted from the active layer 61 and n is the refractive index of the material of the layers.

The Al mole fractions of the clad layers 48, 43, 88, and 84 and current diffusion layer 10 are determined to sufficiently transmit the light from the active layer 61. On the bottom surface of the substrate 1, an n-type electrode 12 is formed entirely. On the contact layer 11, a p-type electrode 13 is formed. The diameter of the electrode 13 is about 140 p m so that the light from the active layer 61 emanates from around the electrode 13. FIG. 12B shows a profile of Al mole fractions of the clad layers. The Al mole fraction of the first clad layers 48 and 88 gradually linearly increases in proportion to the distance from the active layer 61.

The Al mole fraction "x" of the second n-type $In_{0.5}(Ga_{1-x}Al_x)_{0.5}P$ clad layer 43 is fixed at 0.8. The Al mole fraction "y" of the first n-type $In_{0.5}(Ga_{1-y}Al_y)_{0.5}P$ clad layer 48 gradually decreases from 0.8 to 0.3 from the second n-type clad layer 43 toward the active layer 61. The Al mole fraction "z" of the first p-type $In_{0.5}(Ga_{1-y}Al_y)_{0.5}P$ clad layer 88 gradually increases from 0.3 to 0.8 from the active layer 61 toward the second p-type clad layer 84. The Al mole fraction "w" of the second p-type $In_{0.5}(Ga_{1-x}Al_x)_{0.5}P$ clad layer 84 is fixed at 0.8. The thickness of each of the second clad layers 43 and 84 is 0.59 $\mu$m and that of each of the first clad layers 48 and 88 is 0.1 $\mu$m.

The DH-LED of FIG. 12a is mounted on a stem, bonded, and sealed with resin, to form a $\phi$ 5-mm lamp. The initial brightness $I_o$ of this lamp is equal to the maximum brightness of the prior art, and the remnant brightness ratio ($\eta = I_{1000}/I_o$) of brightness $I_{1000}$ after 1000 hours of operation at 50 mA to the initial brightness $I_o$ is 85% that is far greater than the prior art.

The high quality of the fifth embodiment is derived from the two clad layers on each side of the active layer 61, with the Al mole fraction of the first clad layers 48 and 88 being low in the vicinities of the active layer 61 and gradually increasing in proportion to the distance from the active layer 61, to improve the crystal quality of each interface between the clad layers 48 and 88 and the active layer 61. The Al mole fractions of the first clad layers 48 and 88 are y=0.8 and z=0.8 at positions where the layers 48 and 88 are in contact with the second clad layers 43 and 84 whose Al mole fractions are each fixed at 0.8 to sufficiently confine carriers in the active layer 61. Consequently, the DH-LED of the fifth embodiment provides high brightness and long service life.

The DH-LED of the fifth embodiment is manufactured according to the same processes as those of the first embodiment. On an $n^+$-type GaAs substrate 1, an n-type GaAs buffer layer 2 of about 0.5 $\mu$m thick having an impurity concentration $N=4\times10^{17}$ cm$^{-3}$ is formed. On the buffer layer 2, a reflection layer 3 is formed by alternately growing 10 to 20 pairs of n-type $In_{0.5}Al_{0.5}P$ film ($N=4\times10^{17}$ cm$^{-3}$) and GaAs film ($N=4\times10^{17}$ cm$^{-3}$) of $\lambda/4n$ thick according to the LPMOCVD technique. Successively grown on the reflection layer 3 are a second n-type $In_{0.5}(Ga_{1-x}Al_x)_{0.5}P$ clad layer 43 ($N=4\times10^{17}$ cm$^{-3}$, x=1.0) of about 0.59 $\mu$m thick and a first n-type $In_{0.5}(Ga_{1-y}Al_y)_{0.5}P$ clad layer 48 ($N=4\times10^{17}$ cm$^{-3}$) of about 0.01 $\mu$m thick with the Al mole fraction "y" being gradually decreased. Decreasing the Al mole fraction "y" from 0.8 to 0.3 is achieved by relatively decreasing the flow rate of TMA with respect to the flow rates of TMI, TMG, and PH3 with the use of a program-controlled mass flow controller. On the clad layer 48, an undoped $In_{0.5}(Ga_{0.7}Al_{0.3})_{0.5}P$ active layer 61 of about 0.6 $\mu$m thick is formed. On the active layer 61, a first p-type $In_{0.5}(Ga_{1-z}Al_z)_{0.5}P$ clad layer 88 ($N=4\times10^{17}$ cm$^{-3}$) of about 0.01 $\mu$m thick is formed with the Al mole fraction "z" being gradually increased from 0.3 to 0.8 with the use of the mass flow controller that controls the flow rate of TMA according to a program. On the clad layer 88, a second p-type $In_{0.5}(Ga_{0.2}Al_{0.6})_{0.5}P$ clad layer 84 ($N=4\times10^{17}$ cm$^{-3}$) of about 0.59 $\mu$m thick and an n-type GaAs current block layer 91 ($N=2\times10^{18}$ cm$^{-3}$) of about 0.02 $\mu$m thick are successively formed according to the LPMOCVD technique. The other processes are the same as those of the first embodiment, and therefore, are not explained again.

Modifications of the fifth embodiment will be explained.

(Example 5.1)

Figure 13A:
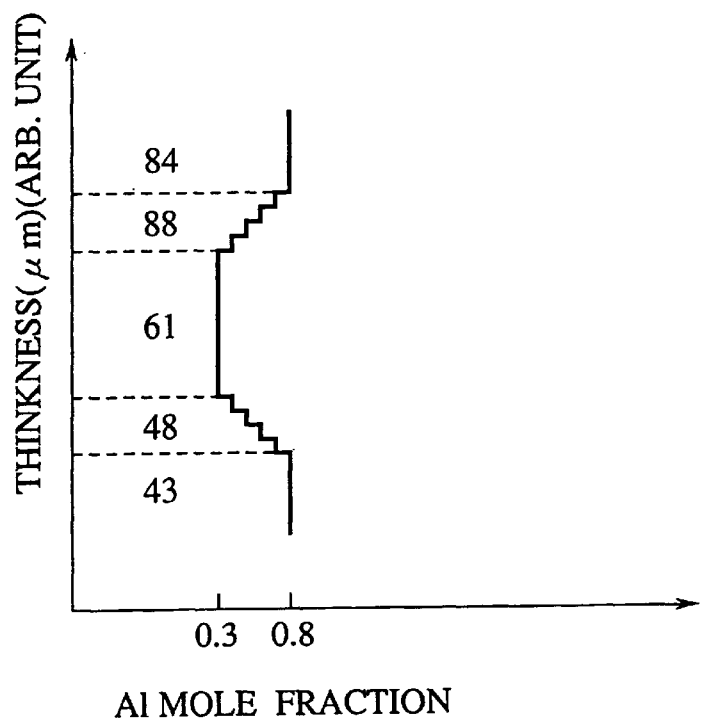
FIGS. 13A to 13D show changes in the Al mole fraction in clad layers around an active layer according to the fifth embodiment.
Figure 13:
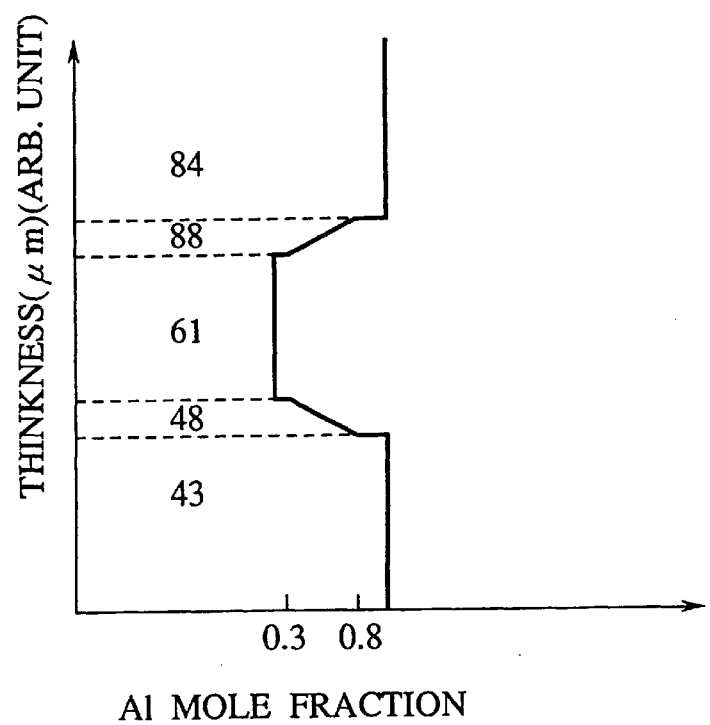

FIG. 13A shows change in the Al mole fractions of clad layers of a DH-LED according to a first modification of the fifth embodiment. Successively formed on an $n^+$-type GaAs substrate 1 are an n-type GaAs buffer layer 2, an n-type InAlP/GaAs reflection layer 3, a second n-type $In_{0.5}(Ga_{0.2}Al_{0.5})_{0.5}P$ clad layer 43, a first n-type $In_{0.5}(Ga_{1-y}Al_y)_{0.5}P$ clad layer 48, an undoped $In_{0.5}(Ga_{0.7}Al_{0.3})_{0.5}P$ active layer 61, a first p-type $In_{0.5}(Ga_{1-z}Al_z)_{0.5}P$ clad layer 88, and a second p-type $In_{0.5}(Ga_{0.2}Al_{0.8})_{0.5}P$ clad layer 84. On a part of the clad layer 84, an n-type GaAs current block layer 91 is formed, and on the current block layer 91, a p-type GaAlAs current diffusion layer 10 and a $p^+$-type GaAs contact layer 11 are sequentially formed.

Each of the first clad layers 48 and 88 has a multilayer structure. Namely, the first n-type clad layer 48 is composed of four films, i.e., n-type $In_{0.5}(Ga_{0.3}Al_{0.7})_{0.5}P$ film, n-type $In_{0.5}(Ga_{0.4}Al_{0.6})_{0.5}P$ film, n-type $In_{0.5}(Ga_{0.5}Al_{0.5})_{0.5}P$ film, and n-type $In_{0.5}(Ga_{0.6}Al_{0.4})_{0.5}P$ film each of 30 nm thick. In this way, the Al mole fraction "y" of these films decreases from the clad layer 43 toward the active layer 61. The first p-type clad layer 88 is composed of four films, i.e., p-type $In_{0.5}(Ga_{0.6}Al_{0.4})_{0.5}P$ film, p-type $In_{0.5}(Ga_{0.5}Al_{0.5})_{0.5}P$ film, p-type $In_{0.5}(Ga_{0.4}Al_{0.6})_{0.5}P$ film, and p-type $In_{0.5}(Ga_{0.3}Al_{0.7})_{0.5}P$ film each of 30 nm thick. In this way, the Al mole fraction "z" of these films increases from the active layer 61 toward the clad layer 84.

The first clad layers 48 and 88 sandwiching the active layer 61 between them have each a multilayer structure with the Al mole fraction thereof increasing from the active layer 61 toward the second clad layers 43 and 84, to improve the crystal quality of each interface between the active layer 61 and the first clad layers 48 and 88. The Al mole fraction of the second clad layers 43 and 84 is high to effectively confine carriers in the active layer 61. The DH-LED of this modification, therefore, provides high brightness and long service life.

(Example 5.2)

FIG. 13B shows change in the Al mole fraction of clad layers of a DH-LED according to a second modification of the fifth embodiment. Successively formed on an $n^+$-type GaAs substrate 1 are an n-type GaAs buffer layer 2, an n-type InAlP/GaAs reflection layer 3, a second n-type $In_{0.5}Al_{0.5}P$ clad layer 43, a first n-type $In_{0.5}(Ga_{1-y}Al_y)_{0.5}P$ clad layer 48, an undoped $In_{0.5}(Ga_{0.6}Al_{0.2})_{0.5}P$ active layer 61, a first p-type $In_{0.5}(Ga_{1-z}Al_z)_{0.5}P$ clad layer 88, and a second p-type $In_{0.5}Al_{0.5}P$ clad layer 84.

On a part of the second clad layer 84, an n-type GaAs current block layer 91 is formed, and on the current block layer 91, a p-type GaAlAs current diffusion layer 10 and a $p^+$-type GaAs contact layer 11 are sequentially formed.

The Al mole fraction "y" of the first n-type clad layer 48 linearly decreases from 0.8 to 0.3 from the clad layer 43 toward the active layer 61. The Al mole fraction "z" of the first p-type clad layer 88 linearly increases from 0.3 to 0.8 from the active layer 61 toward the clad layer 84. Unlike the profile of FIG. 12B, the profile of the Al mole fraction of FIG. 13B has a step at each interface between the active layer 61 and the first clad layers 48 and 88 and at each interface between the first clad layers 48 and 88 and the second clad layers 43 and 84. In spite of this, the structure of FIG. 13B provides substantially the same effect as the fifth embodiment of FIG. 12A.

In this way, the second modification of FIG. 13B arranges the clad layers 48 and 43 on one side of the active layer 61 and the clad layers 88 and 84 on the other side thereof. The Al mole fraction of the first clad layers 48 and 88 linearly changes from 0.3 to 0.8 outwardly from the active layer 61, to decrease the Al mole fraction in each interface along the active layer 61 and improve the crystal quality of the interfaces. The Al mole fraction of the second clad layers 43 and 84 distal from the active layer 61 is high to sufficiently confine carriers in the active layer 61. As a result, the DH-LED of the second modification provides high brightness and long service life.

(Example 5.3)

Figure 13C:
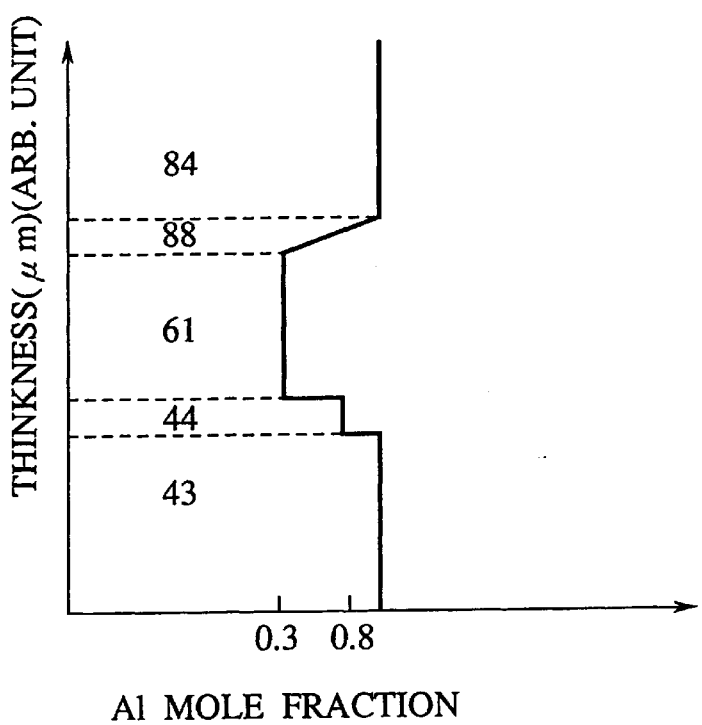

FIG. 13C shows change in the Al mole fraction of clad layers of a DH-LED according to the third modification of the fifth embodiment. This modification is characterized in that it changes the Al mole fraction of only one first clad layer between 0.3 and 0.8. This structure is capable of providing the same effect as that of FIG. 12A.

The Al mole fraction of a first n-type clad layer 44 is constant (y=0.7), and that (z) of a first p-type clad layer 88 increases from 0.3 to 1.0 in proportion to the distance from an active layer 61. Alternatively, the Al mole fraction "z" of the first p-type clad layer 88 may be constant, and that (y) of the first n-type clad layer 44 may gradually be increased in proportion to the distance from the active layer 61.

In this way, the third modification linearly changes the Al mole fraction of one of the first clad layers that sandwich the active layer so that the Al mole fraction of the layer may increase in proportion to the distance from the active layer, to improve the crystal characteristics of an interface between the active layer and the clad layer and efficiently confine carriers in the active layer. The DH-LED of the third modification, therefore, provides high brightness and long service life.

(Example 5.4)

Figure 13D:
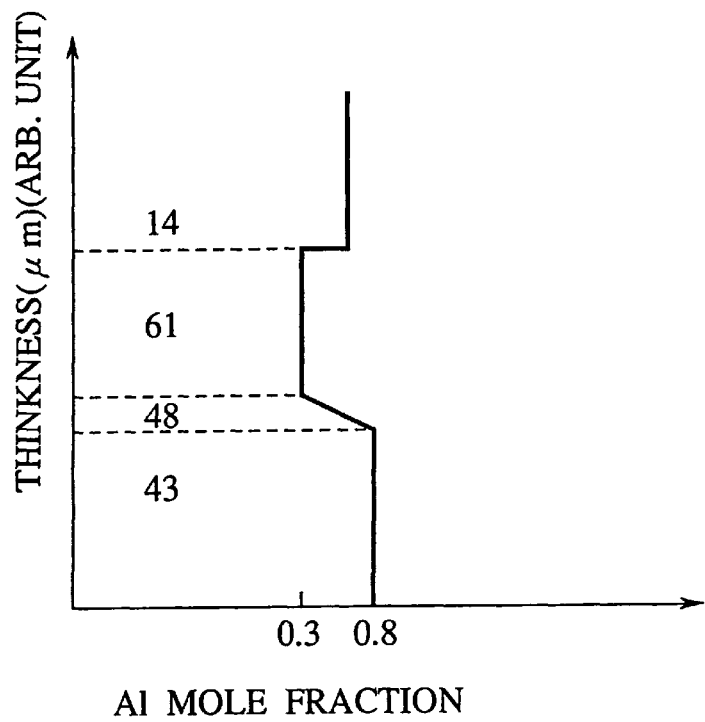

FIG. 13D shows change in the Al mole fraction of clad layers of a DH-LED according to a fourth modification of the fifth embodiment. This modification is characterized in that multiple clad layers are formed on only one side of an active layer similar to the second embodiment of FIGS. 6 and 7 and in that the Al mole fraction of a first one of the multiple clad layers is linearly changed. This structure provides the same effect as the fifth embodiment.

The DH-LED of FIG. 13D has a p-type $In_{0.4}Al_{0.6}P$ clad layer 14 of about 0.6 $\mu m$ thick, a first n-type $In_{0.5}(Ga_{1-y}Al_y)_{0.5}P$ clad layer 48 of about 0.01 $\mu m$ thick whose Al mole fraction "y" varies, and a second n-type $In_{0.5}(Ga_{0.2}Al_{0.8})_{0.5}P$ clad layer 43 of about 0.59 $\mu m$ thick. Instead, the DH-LED may have one n-type clad layer and two p-type clad layers 88 and 84 as shown in FIG. 12A.

In this way, the fourth modification forms two clad layers only on one side of an active layer with the Al mole fraction of a first one of the two clad layers being linearly changed from a low level in the vicinity of the active layer to a high level at a distal end of the clad layer. This arrangement improves the crystal quality of an interface between the active layer and the first clad layer and effectively confine carriers in the active layer. The DH-LED of the fourth modification provides high brightness and long service life.

Various modifications will become possible for those skilled in the art after receiving the teachings of the present disclosure without departing from the scope thereof. Although the first to fifth embodiments employ first and second clad layers, it is possible to arrange more clad layers outside the second clad layers. The present invention is applicable to InGaAlP-based LEDs for emitting visible light of from green to red, GaN-based LEDs for emitting visible light of blue, and GaAs-based LEDs for emitting infrared light.

The clad layers may be made of mixed crystals of groups III and V such as InGaN and InGaAsP, or mixed crystals of groups II and VI such as ZnSeTe, MgSeTe, ZnSSe, and MgSSe.

The fifth embodiment linearly changes the Al mole fractions "y" and "z" of the first clad layers 48 and 88. These Al mole fractions may be changed according to a quadratic curve, a cubic curve, or an exponential curve. Gradually increasing and decreasing Al mole fractions of the fifth embodiment may be combined with any one of the third and fourth embodiments. When the fifth embodiment is combined with the fourth embodiment, the Al mole fraction "y" of the first n- and p-type clad layers is gradually increased and decreased with respect to the Al mole fraction "x" of the active layer in the range of $x+0.1 \leq y \leq x+0.5$.

Figure 14A:
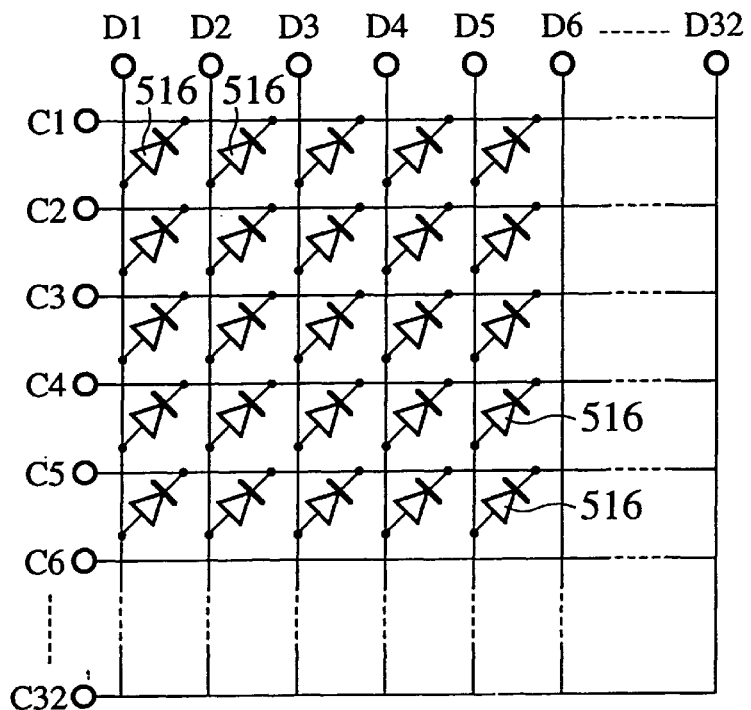
FIGS. 14A and 14B show LED matrix circuits each having an X-Y matrix of the semiconductor light emitting devices of the present invention.

The DH-LEDs of the present invention provide high brightness and long service life, and therefore, are applicable to indoor and outdoor display panels. The LEDs may be arranged in an X-Y matrix fashion to form an LED matrix circuit, or the LED matrix circuit may be arranged side by side to form an LED module panel. FIG. 14A shows an example of the LED matrix circuit having $\phi$ 5-mm to $\phi$10-mm lamps 516 based on any one of the embodiments of FIGS. 5 to 9 and 12A. The red and green lamps (or LEDs) are arranged in a 32-by-32 matrix serving as dots. The LED matrix circuit of FIG. 14A has a matrix of 32 data lines D1 to D32 and 32 scan lines C1 to C32 with the LEDs 516 being connected to the intersections of the data and scan lines. Two sets (not shown) of the matrix of 32 data lines and 32 scan lines of FIG. 14A are arranged for the red and green LED groups, respectively.

Figure 14B:
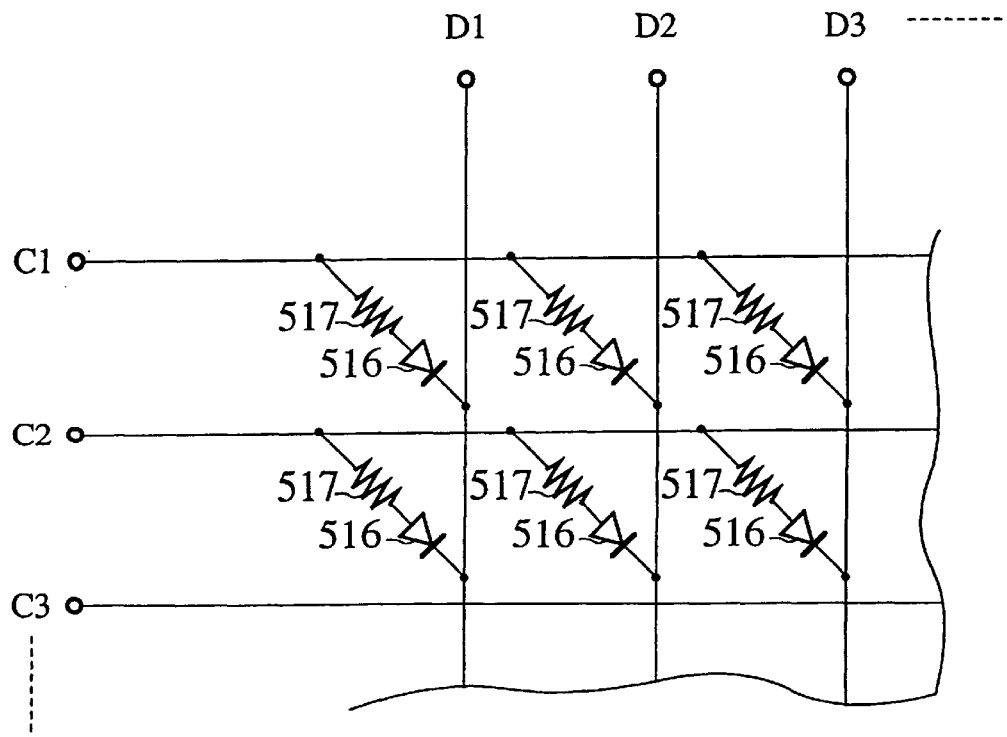

Each LED lamp 516 may have a current control resistor 517 as shown in FIG. 14B. The resistor 517 adjusts a current flowing to the LED lamp 516, to equalize the brightness of light among the LED lamps 516. Two sets (not shown) of the matrix of 32 data lines D1, D2, . . . , D32 and 32 scan lines C1, C2, . . . , C32 of FIG. 14B are arranged for the red and green LED groups, respectively. The LED matrix circuit (or dot-matrix circuit) of any one of FIGS. 14A and 14B is used to fabricate an outdoor/indoor LED display apparatus of FIG. 15.

Figure 15:
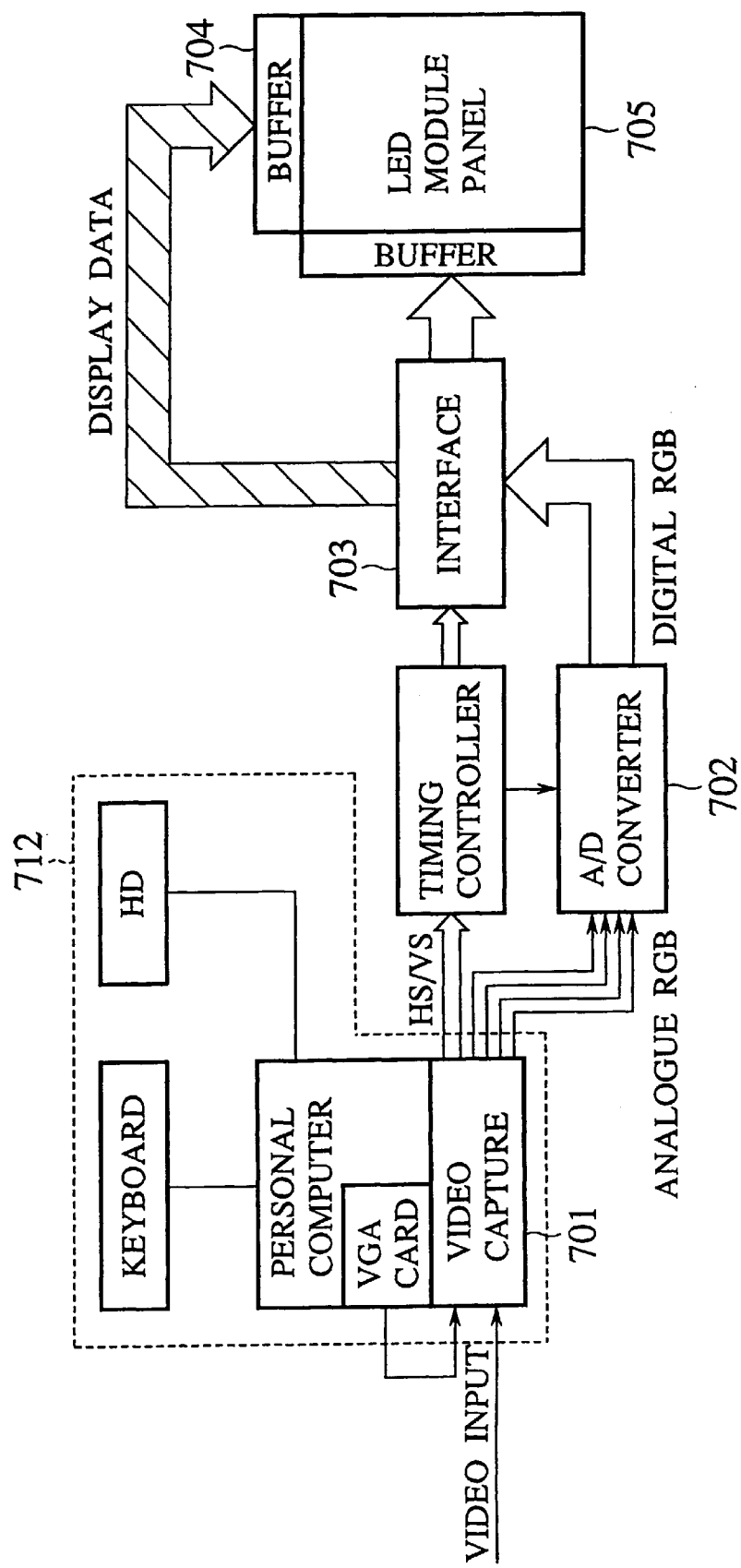
FIG. 15 shows an LED module panel having LED matrix circuits arranged side by side each being any one of those of FIGS. 14A and 14B, and components for driving and controlling the panel.

An LED module panel 705 of the apparatus of FIG. 15 has a plurality of LED matrix circuits each being any one of FIGS. 14A and 14B, to provide a large screen. An external computer 712 incorporates a video capture unit 701 that provides an analog RGB signal. An A/D converter 702 converts the signal into a digital RGB signal, which is processed by an interface 703 into a display data signal. The display data signal is supplied to the LED matrix circuits of the panel 705 through a buffer 704. The LED lamps of the LED matrix circuits emit light in response to the display data signal, to display an image having gradations. Each LED of the LED matrix circuits of the apparatus of FIG. 15 has good crystal quality and effectively confines carriers due to the DH structure. Accordingly, the apparatus of FIG. 15 is efficient, has long service life, is visible from a long distance, and is reliable.

What is claimed is:

1. A light emitting diode for emitting spontaneous radiation and having a double heterostructure, comprising:
    (a) an active layer for emitting the spontaneous radiation having a given wavelength;
    b) a first clad layer of a first conductivity type formed on the active layer;
    c) a second clad layer, separate from the other structures, of the first conductivity type formed on the first clad layer of the first conductivity type;
    d) a semiconductor layer uniformly formed on a whole surface of the second clad layer of the first conductivity type;
    e) an upper metal electrode formed over a part of the semiconductor layer so as to define an optical aperture for emitting upward the spontaneous radiation from said active layer through said first and second clad layer of the first conductivity type and the semiconductor layer;
    f) a first clad layer of a second conductivity type formed under the active layer;
    g) a second clad layer separate from other structures of the second conductivity type formed under the first clad layer of the second conductivity type; and
    h) a substrate formed under the second clad layer of the second conductivity type,
    a forbidden band gap of the first clad layer of the first conductivity type being smaller than that of the second clad layer of the first conductivity type, and the forbidden band gap of the first clad layer of the second conductivity type being smaller than that of the second clad layer of the second conductivity type.

2. The diode of claim 1, further comprising:
    a U-shaped trench penetrating said semiconductor layer, said first and second clad layer of the first conductivity type, said active layer, and said first clad layer of the second conductivity type; and
    a lower metal electrode formed on a part of said second clad layer of the second conductivity type.

3. The diode of claim 2, wherein the substrate is made of sapphire.

4. The diode of claim 1, wherein the active layer is made of GaN based semiconductor.

5. The diode of claim 4, wherein the active layer is made of InGaN.

6. The diode of claim 5, wherein the first and the second clad layer of the first conductivity type are made of AlGaN.

7. The diode of claim 6, wherein the first clad layer of the first conductivity type is made of p-type $Al_{0.05}Ga_{0.95}N$ and the second clad layer of the first conductivity type is made of p-type $Al_{0.2}Ga_{0.8}N$.

8. The diode of claim 5, wherein the first and the second clad layer of the second conductivity type are made of AlGaN.

9. The diode of claim 8, wherein the first clad layer of the second conductivity type is made of n-type $Al_{0.05}Ga_{0.95}N$ and the second clad layer of the second conductivity type is made of n-type $Al_{0.2}Ga_{0.8}N$.

10. The diode of claim 1, wherein the substrate is made of sapphire.

11. The diode of claim 1, wherein the Al mole fractions of the first clad layers of the first and second conductivity type gradually increase in proportion to the distance from the active layer, respectively.

12. The diode of claim 1, wherein the thickness of each of the first clad layers of the first and second conductivity types is in the range of 0.005 to 0.1 $\mu$m, and the thickness of each of the second clad layers of the first and second conductivity types is in the range of 0.005 to 0.1 $\mu$m.

13. The diode of claim 12, wherein the total thickness of the first and second clad layers of the first conductivity type is 0.05 to 1.0 $\mu$m, and the total thickness of the first and second clad layers of the second conductivity type is 0.05 to 0.1 $\mu$m.

14. A light emitting diode for emitting a spontaneous radiation having a double heterostructure comprising:
    a) an active layer for emitting the spontaneous radiation having a given wavelength;
    b) a first clad layer of a first conductivity type formed on the active layer;
    c) a second clad layer, separate from other structures of the first conductivity type formed on the first clad layer of the first conductivity type;
    d) a semiconductor layer formed on the second clad layer of the first conductivity type;
    e) an upper metal electrode formed over a part of the semiconductor layer so as to define an optical aperture for emitting upward the spontaneous radiation from said active layer through said first and second clad layer of the first conductivity type and the semiconductor layer;
    f) a first clad layer of a second conductivity type formed under the active layer;
    g) a second clad layer, separate from other structures of the second conductivity type formed under the first clad layer of the second conductivity type;
    h) a substrate formed under the second clad layer of the second conductivity type;
    i) a U-shaped trench penetrating said semiconductor layer, said first and second clad layer of the first conductivity type, said active layer, and said first clad layer of the second conductivity type down to said second clad layer of the second conductivity type; and
    j) a lower metal electrode formed on a part of said second clad layer of the second conductivity type,
    a forbidden band gap of the first clad layer of the first conductivity type being smaller than that of the second clad layer of the first conductivity type, and the forbidden band gap of the first clad layer of the second conductivity type being smaller than that of the second clad layer of the second conductivity type.

15. The diode of claim 14, wherein the active layer is made of GaN based semiconductor.

16. The diode of claim 15, wherein the active layer is made of InGaN.

17. The diode of claim 16, wherein the first and the second clad layer of the first conductivity type are made of AlGaN.

18. The diode of claim 17, wherein the first clad layer of the first conductivity type is made of p-type $Al_{0.05}Ga_{0.95}N$ and the second clad layer of the first conductivity type is made of p-type $Al_{0.2}Ga_{0.8}N$.

19. The diode of claim 16, wherein the first and the second clad layer of the second conductivity type are made of AlGaN.

20. The diode of claim 19, wherein the first clad layer of the second conductivity type is made of n-type $Al_{0.05}Ga_{0.95}N$ and the second clad layer of the second conductivity type is made of n-type $Al_{0.2}Ga_{0.8}N$.

21. The diode of claim 14, wherein the substrate is made of sapphire.

22. A light emitting diode for emitting a spontaneous radiation and having a double heterostructure, comprising:

a) an active layer for emitting the spontaneous radiation having a given wavelength;

b) a first clad layer of a first conductivity type formed on the active layer;

c) a second clad layer, separate from other structures, of the first conductivity type formed on the fist clad layer of the first conductivity type;

d) a semiconductor layer uniformly formed on a whole surface of the second clad layer of the first conductivity type;

e) an upper metal electrode formed over a part of the semiconductor layer so as to define an optical aperture for emitting upward the spontaneous radiation from said active layer through said first and second clad layer of the first conductivity type and the semiconductor layer;

f) a first clad layer of a second conductivity type formed under the active layer;

g) a second clad layer, separate from other structures, of the second conductivity type formed under the first clad layer of the second conductivity type; and h) a substrate formed under the second clad layer of the second conductivity type, wherein a forbidden band gap of the first clad layer of the first conductivity type being smaller than that of the second clad layer of the first conductivity type, and the forbidden band gap of the first clad layer of the second conductivity type being smaller than that of the second clad layer of the second conductivity type, and wherein the active layer, the first and second clad layers of the first conductivity type, and the first and second clad layers of the second conductivity type are each made of compound semiconductor containing Al, the Al mole fraction of the active layer is smaller than that of the first clad layers of the first and second conductivity types, and the Al mole fraction of the second clad layers of the first and second conductivity is larger than that of the first clad layers of the first and second conductivity type.

23. The diode of claim 22, wherein the Al mole fraction of the active layer includes zero.

* * * * *